United States Patent
Takaki

(10) Patent No.: US 9,595,566 B2
(45) Date of Patent: Mar. 14, 2017

(54) FLOATING STAIRCASE WORD LINES AND PROCESS IN A 3D NON-VOLATILE MEMORY HAVING VERTICAL BIT LINES

(71) Applicant: SANDISK TECHNOLOGIES LLC, Plano, TX (US)

(72) Inventor: Seje Takaki, Mie (JP)

(73) Assignee: SanDisk Technologies LLC, Plano, TX (US)

( * ) Notice: Subject to any disclaimer, the term of this patent is extended or adjusted under 35 U.S.C. 154(b) by 149 days.

(21) Appl. No.: 14/631,616

(22) Filed: Feb. 25, 2015

(65) Prior Publication Data

US 2016/0247859 A1    Aug. 25, 2016

(51) Int. Cl.
| | |
|---|---|
| H01L 27/24 | (2006.01) |
| G11C 5/06 | (2006.01) |
| H01L 45/00 | (2006.01) |
| G11C 5/02 | (2006.01) |
| G11C 16/08 | (2006.01) |

(52) U.S. Cl.
CPC .......... *H01L 27/2481* (2013.01); *G11C 5/025* (2013.01); *G11C 5/06* (2013.01); *G11C 16/08* (2013.01); *H01L 27/249* (2013.01); *H01L 45/122* (2013.01); *H01L 45/16* (2013.01)

(58) Field of Classification Search
CPC . H01L 27/2481; H01L 27/249; H01L 45/122; H01L 45/16; G11C 5/06; G11C 16/08; G11C 5/025
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 8,243,495 B2 * | 8/2012 | Choi | G11C 5/063 365/148 |
| 8,553,476 B2 | 10/2013 | Yan et al. | |
| 8,895,437 B2 | 11/2014 | Cernea et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

* cited by examiner

*Primary Examiner* — Jose R Diaz
(74) *Attorney, Agent, or Firm* — Vierra Magen Marcus LLP

(57) ABSTRACT

A 3D nonvolatile memory has memory elements arranged in a three-dimensional pattern with a plurality of memory layers stacked over a semiconductor substrate. It has a 2D array of vertical bit lines and a plurality of staircase word lines. Each staircase word line has a series of alternating segments and risers and traverses the plurality of memory layers with a segment in each memory layer. The plurality of staircase word lines have their segments lined up to form a 2D array of stacks of segments. Riser for a pair of segments from each adjacent stacks at different memory layers is provided by a conductive sidewall layer of a stairwell disposed between the adjacent stacks. Multiple insulated conductive sidewall layers provide multiple risers for the adjacent stacks. Layer-by-layer stairwell excavation and sidewall processes between adjacent stacks create risers for different pairs of segments between stacks to form the staircase word lines.

20 Claims, 19 Drawing Sheets

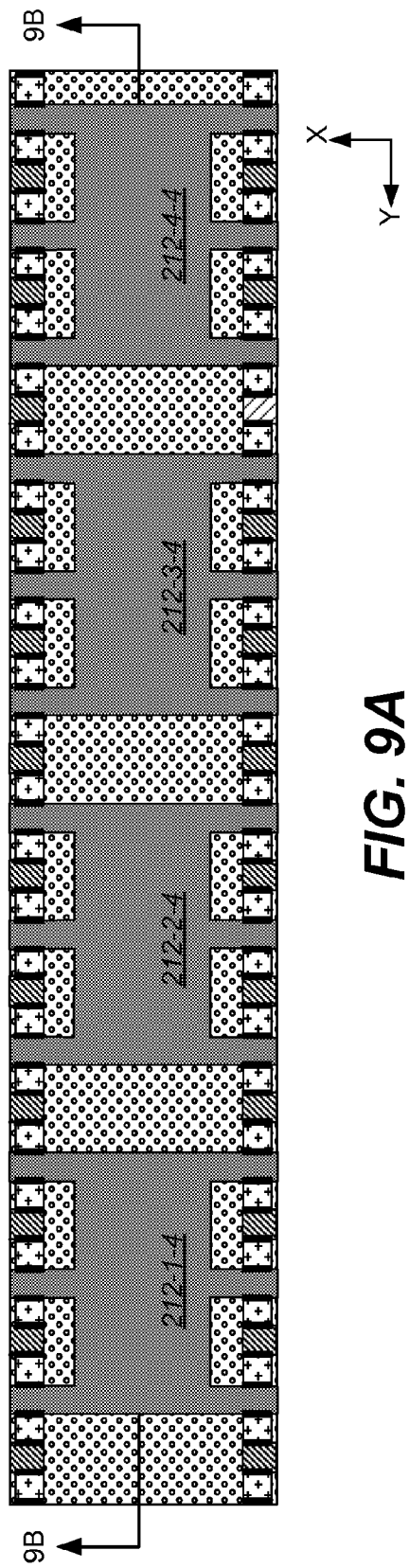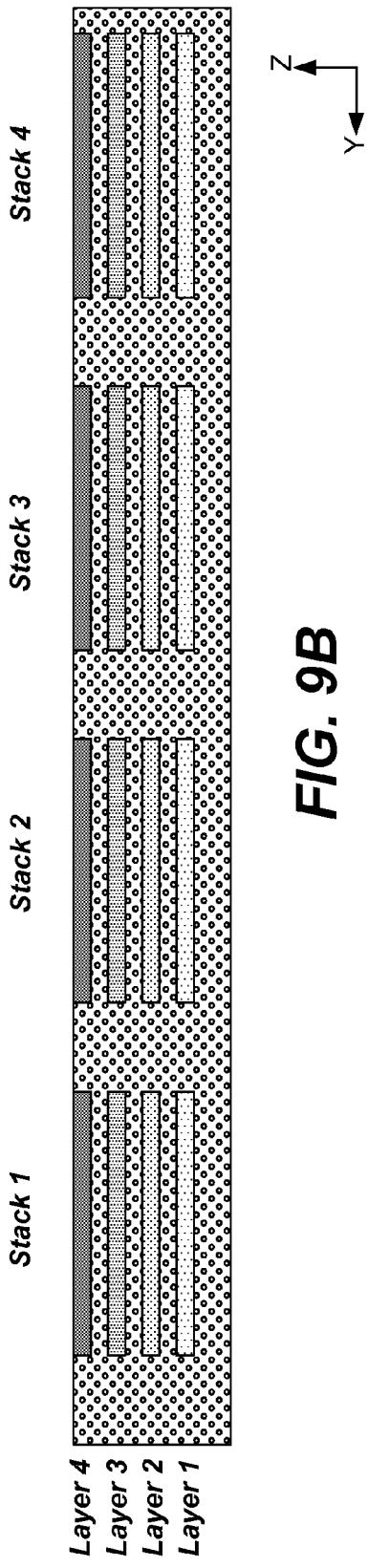
FIG. 9A
FIG. 9B

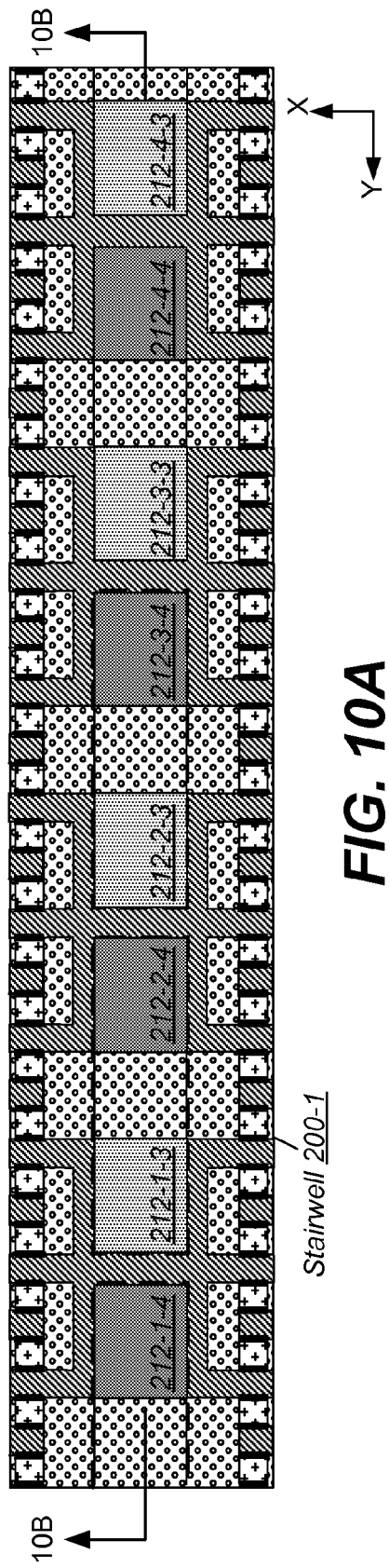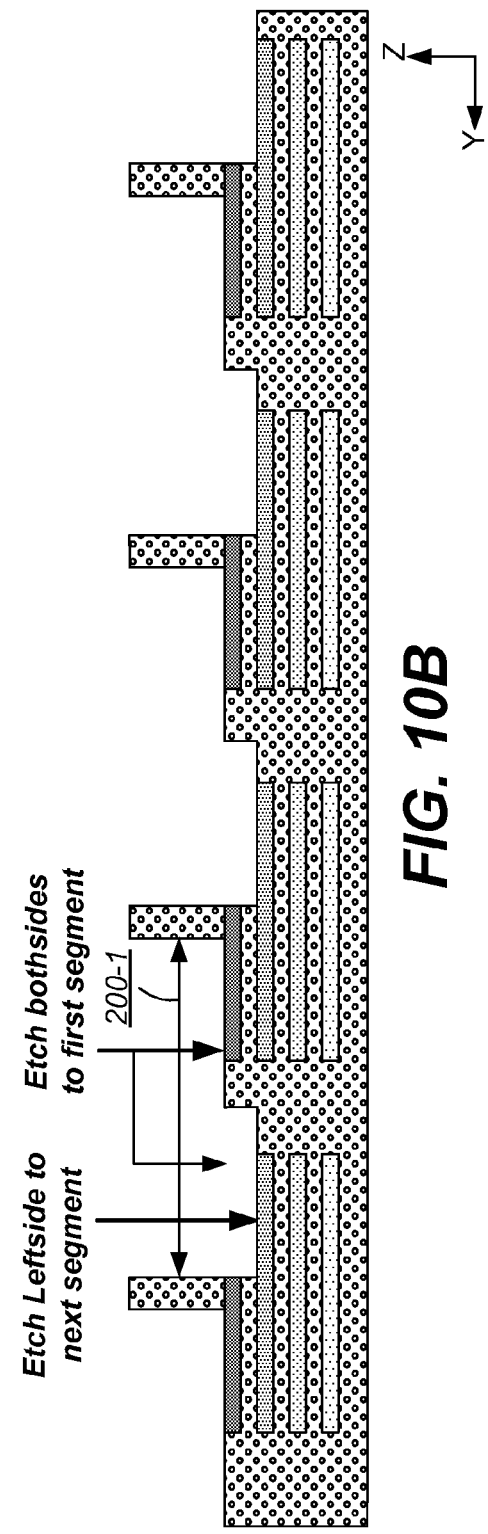
FIG. 10A
FIG. 10B

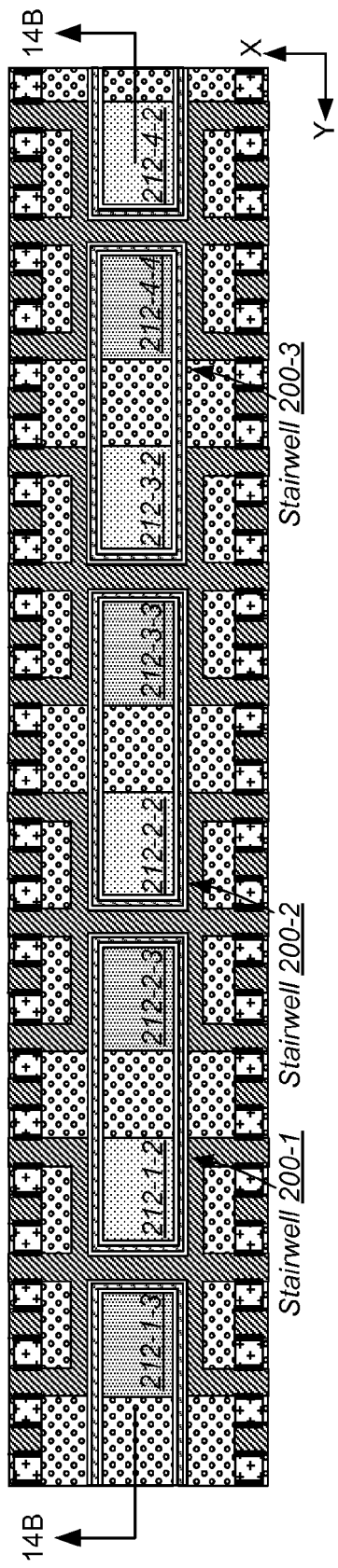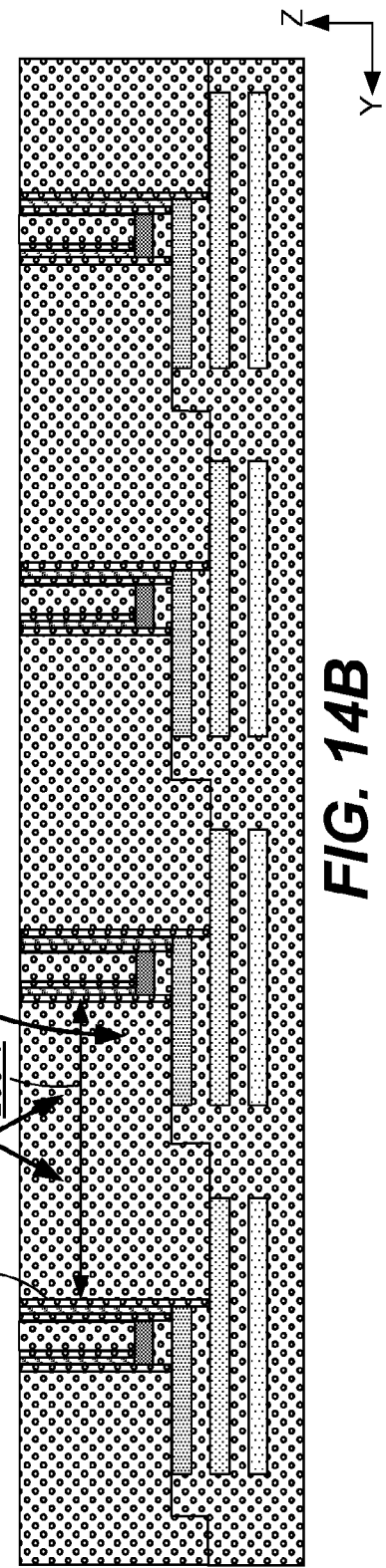
FIG. 14A
FIG. 14B

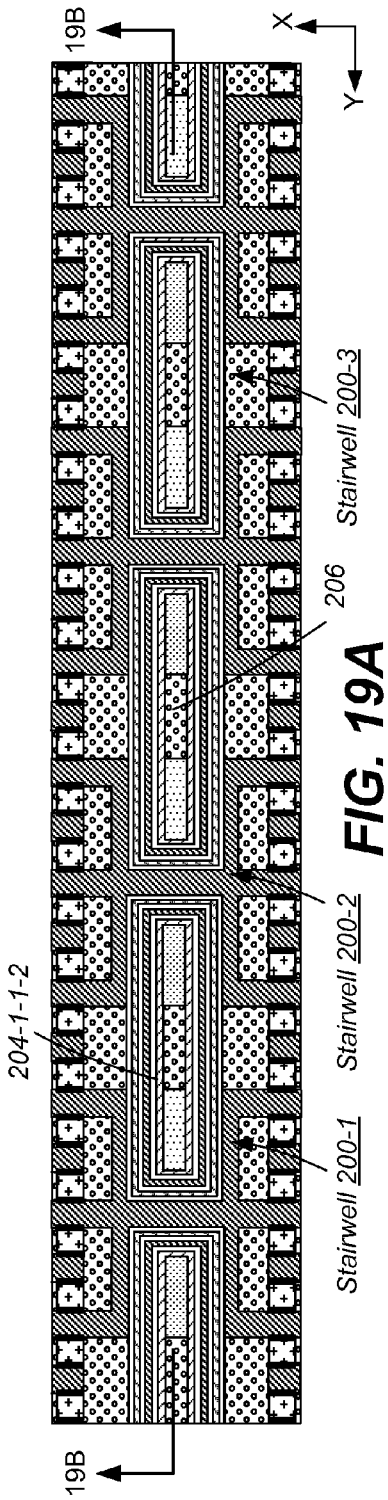
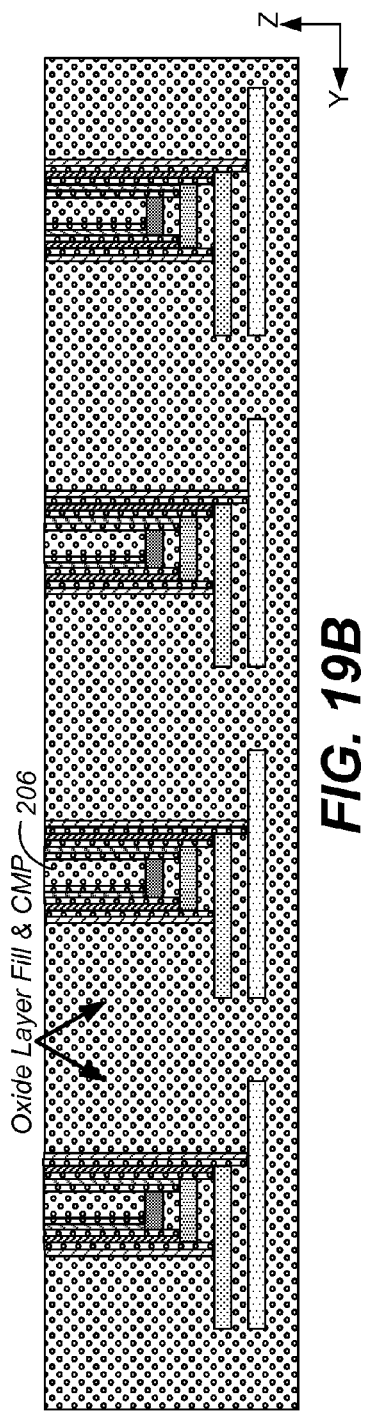
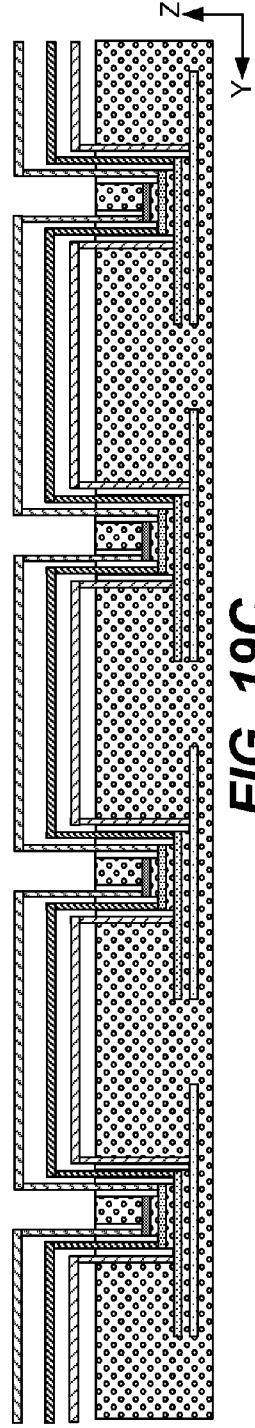
FIG. 19A
FIG. 19B
FIG. 19C

FLOATING STAIRCASE WORD LINES AND PROCESS IN A 3D NON-VOLATILE MEMORY HAVING VERTICAL BIT LINES

BACKGROUND

This application relates generally to the structure, use and making of re-programmable non-volatile memory cell arrays, and, more specifically, to one having staircase word lines for accessing three-dimensional arrays of memory storage elements formed on and above semiconductor substrates.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

There are many commercially successful semiconductor memory devices being used today. These semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magneto-resistive random access memory ("MRAM"), and other semiconductor elements capable of storing information. Furthermore, each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. It will be recognized that the NAND and NOR memory configurations are exemplary, and memory elements may be otherwise configured.

The semiconductor memory elements of a single device, such as elements located within and/or over the same substrate or in a single die, may be distributed in two or three dimensions, such as a two dimensional array structure or a three dimensional array structure.

In a two dimensional memory structure, the semiconductor memory elements are arranged in a single plane or single memory device layer. Typically, in a two dimensional memory structure, memory elements are located in a memory layer (e.g., in an x-z direction plane) which extends substantially parallel to a major surface of a substrate that supports the memory elements. The substrate may be a wafer over which the layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood in the art. The memory elements may each have two or more electrodes or contact lines, such as bit lines and word lines.

A three dimensional memory array is organized so that memory elements occupy multiple planes or multiple memory layers, forming a structure in three dimensions (i.e., in the x, y and z directions, where the y direction is substantially perpendicular and the x and z directions are substantially parallel to the major surface of the substrate).

As a non-limiting example, each memory layer in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked memory layers. The columns may be arranged in a two dimensional configuration, e.g., in an x-z plane, thereby resulting in a three dimensional arrangement of memory elements. It will be understood that other configurations of memory elements in three dimensions will also constitute a three dimensional memory array.

By way of non-limiting example, in a three dimensional NAND memory array, the memory elements may be connected together to form a NAND string within a single horizontal (e.g., x-z) plane. Alternatively, the memory elements may be connected together to extend through multiple horizontal planes. Other three dimensional configurations can be envisioned wherein some NAND strings contain memory elements in a single memory level while other strings contain memory elements which extend through multiple memory levels. Three dimensional memory arrays may also be designed in a NOR configuration and in a ReRAM configuration.

A monolithic three dimensional memory array is one in which multiple memory levels are formed above and/or within a single substrate, such as a semiconductor wafer. In a monolithic three-dimensional array the layers of each level of the array are formed on the layers of each underlying level of the array. It will be understood that layers of adjacent levels of a monolithic three dimensional memory array may be shared or have intervening layers between memory levels. In contrast, two dimensional arrays may be formed separately and then packaged together to form a non-monolithic memory device. For example, non-monolithic stacked memories have been constructed by forming memory levels on separate substrates and adhering the memory levels atop each other. The substrates may be thinned or removed from the memory levels before bonding, but as the memory levels are initially formed over separate substrates, such memories are not monolithic three dimensional memory arrays. Further, multiple two dimensional memory arrays or three dimensional memory arrays (monolithic or non-monolithic) may be formed separately and then packaged together to form a stacked-chip memory device.

U.S. Pat. No. 8,895,437 B2 discloses a 3D memory having memory elements arranged in a three-dimensional pattern defined by rectangular coordinates having x, y and z-directions and with a plurality of parallel memory layers stacked in the z-direction over a semiconductor substrate. Each memory layer contains a 2-D layer of memory elements. The memory elements are accessed by vertical local bit lines along the z-direction and a plurality of staircase word lines along the x-direction. Each flight of staircase word line has a series of alternating segments and risers elongated respectively in the x-direction and z-direction traversing across the plurality of memory layers in the z-direction with a segment in each memory layer. The structure of staircase word lines allows every flight of staircase word line to reach to a surface layer of the 3D memory for hook-up. However, there is a stair-interconnection-area (riser) penalty for each stairs, which encroaches into the memory area. Moreover, the process of forming the riser connections in each staircase is complicated. Additional lithography, etching, deposition processes for each stair-interconnection will incur higher cost and increase defect density.

Thus, there is a need to provide a memory device and processing method where each flight of staircase word line has a simpler connection between the segments across the different layers so that they can be optimally and efficiently formed.

SUMMARY

Staircase Word Lines with Risers Formed by a Stairwell's Sidewalls

A 3D non-volatile memory has memory elements arranged in a three-dimensional pattern in a plurality of parallel memory layers stacked over a semiconductor substrate. The memory elements are accessed by a plurality of staircase word line. Each staircase word line is constituted from a series of alternating segments (steps) and risers with each segment residing in a memory layer, and each riser joining a segment to an adjacent segment in a different memory layer, such that the staircase word line steps up and traverses from a bottom to a top memory layer. The riser connecting two adjacent segments is effected by a conductive sidewall of a stairwell bridging the two adjacent segments.

The segments from all the staircase word lines form a 2D array of stacks of segments, each stack of segments being a column of segments contributed from each memory plane. A stairwell is between adjacent first and second stacks of segments, and the stairwell has internal sidewalls with interleaving isolation and conductive layers. Each conductive layer is selectively connecting a first segment in the first stack to a second segment in the second stack where the first and second segments are in different memory layers.

Process for Forming Staircase Word Lines Using Stairwell's Sidewall Connections

Essentially, the process starts with a multi-layer memory slab with the 2D array of stacks of segments (or steps) but not the risers formed in place. A first segment in a first memory layer from a first stack and a second segment in a second memory layer from a second adjacent stack are then connected by excavating a stairwell between the first and second stacks of segments, and forming the connections between the first and second segments using a sidewall process. The excavating process includes etching down the stairwell to expose the first and second segments. The sidewall process includes forming an insulated conductive sidewall layer connected to the first and second segments.

Unlike prior staircase word line structures, the present scheme has the formation of the segments of the staircase word line decoupled from the formation of the risers. This allows the segments to be formed efficiently and the formation of risers to be optimized. Furthermore, the risers are formed outside the memory cell portion of the array, which simplify layout of the memory cell portion.

The space occupied by the stairwell for the risers is approximately 400 nm for a memory with 19 memory layers, or approximately 20 nm per memory layers.

Only four lithography processes are needed to form the stairwell and sidewalls in any number of memory layers.

In another implementation, a bifurcated sidewall process allows two risers to be formed for each sidewall process. Initially, a sidewall conductive layer connects between a pair of first and second segments and also a pair of third and fourth segments. The sidewall conductive layer is then bifurcated into two independent sidewall conductive layers, one for connecting between first and second segments and the other for connecting between third and fourth segments.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIG. 9A is a top view of a portion of the 3D memory in the x-y plane illustrates word line segments. Four stacks of segments are shown, similar to that those shown in FIG. 5.

FIG. 9B is a sectional view in the y-z plane of FIG. 9A.

FIG. 10A is a top view of a portion of the 3D memory in the x-y plane, illustrating the state of the stairwell portions after first and second maskings and corresponding first and second etchings.

FIG. 10B is a sectional view in the y-z plane of the 3D memory shown in FIG. 10A.

FIG. 14A is a top view of a portion of the 3D memory in the x-y plane, showing the state of the stairwell portion after deposition of an isolation layer and an anisotropic etch-back process to form the isolation layer on the sidewalls around the exposed portion of the stairwells.

FIG. 14B is a sectional view in the y-z plane of the 3D memory shown in FIG. 14A.

FIG. 19A is a top view of a portion of the 3D memory in the x-y plane, showing the state of the stairwell portions after a gap fill process which is consist of SiO2 fill 206 and SiO2 CMP (chemical-mechanical planarization).

FIG. 19B is a sectional view in the y-z plane of the 3D memory shown in FIG. 19A.

FIG. 19C is a sectional view in the y-z plane of the 3D memory shown in FIG. 19A.

DESCRIPTION OF EXEMPLARY EMBODIMENTS

Figure 1:
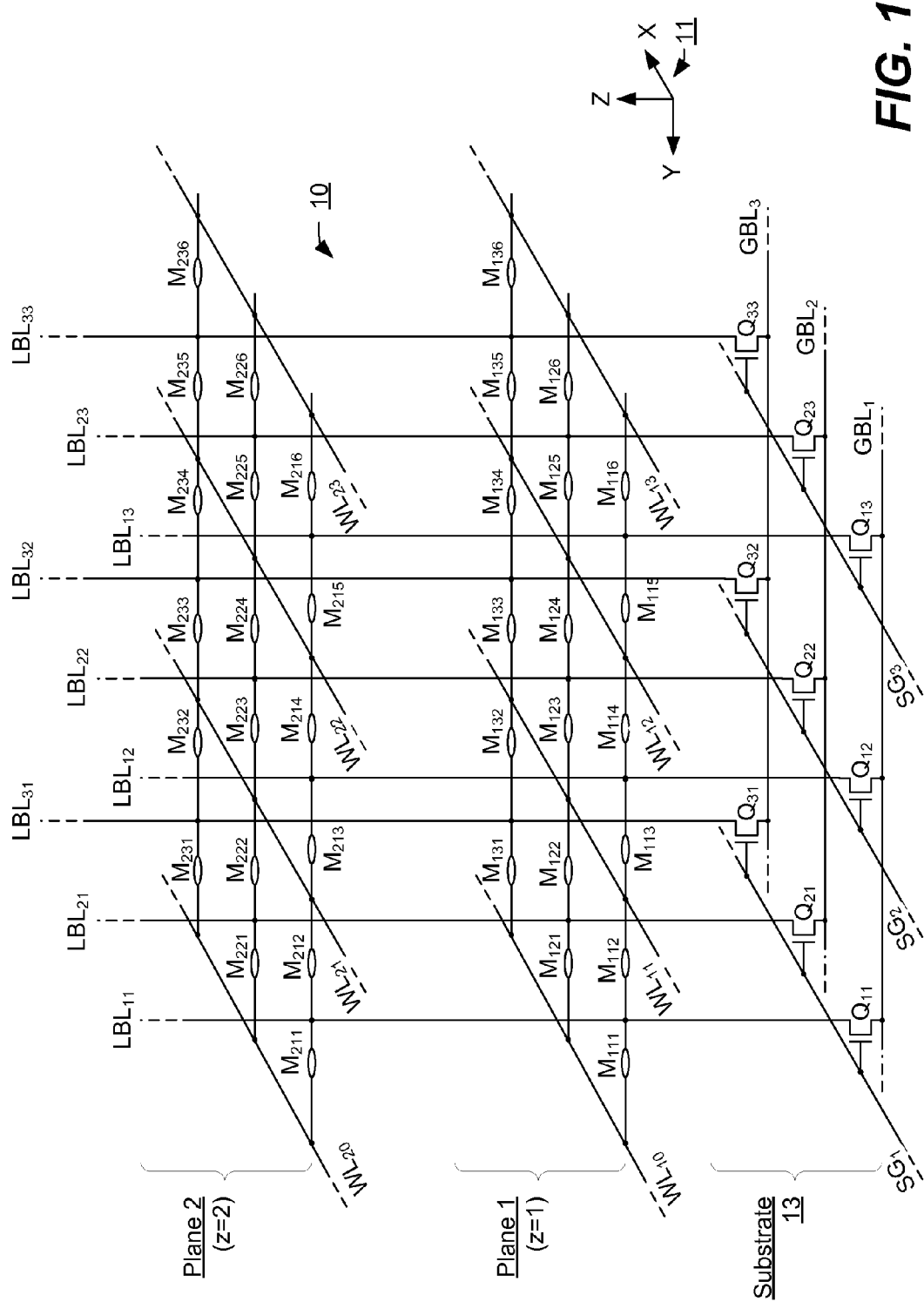
FIG. 1 illustrates schematically an architecture of a three-dimensional memory in the form of an equivalent circuit of a portion of such a memory.

Referring initially to FIG. 1, an architecture of a three-dimensional memory 10 is schematically and generally illustrated in the form of an equivalent circuit of a portion of such a memory. This is a specific example of the three-dimensional array summarized above. A standard three-dimensional rectangular coordinate system 11 is used for reference, the directions of each of vectors x, y and z being orthogonal with the other two.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off. It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes or memory layers positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
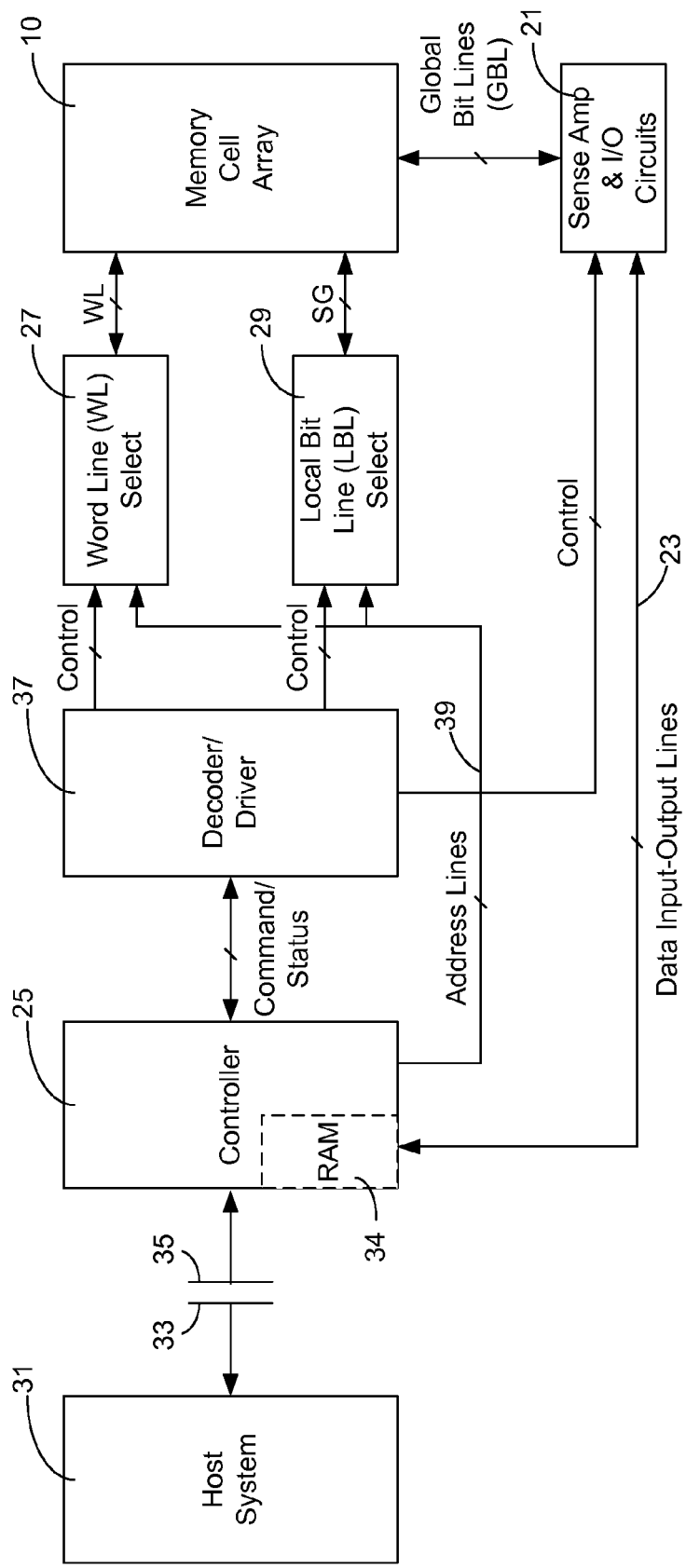
FIG. 2 is a block diagram of an illustrative memory system that can use the three-dimensional memory 10 of FIG. 1.

FIG. 2 is a block diagram of an illustrative memory system that can use the three-dimensional memory 10 of FIG. 1. Sense amplifier and I/O circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the sense amplifier and I/O circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations to carry out given commands. Control signals resulting from decoding commands are applied from the circuits 37 to the word line select circuits 27, local bit line select circuits 29 and sense amplifier and I/O circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. In some arrays, the word lines may be segmented (not shown in FIG. 1) so that only a portion of the total number of memory elements connected along their length may be addressed for parallel operation, namely the memory elements connected to a selected one of the segments.

Previously programmed memory elements whose data have become obsolete may be addressed and re-programmed from the states in which they were previously programmed. The states of the memory elements being re-programmed in parallel will therefore most often have different starting states among them. This is acceptable for many memory element materials but it is usual to re-set a group of memory elements to a common state before they are re-programmed. For this purpose, the memory elements may be grouped into blocks, where the memory elements of each block are simultaneously reset to a common state, preferably one of the programmed states, in preparation for subsequently programming them. If the memory element material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem since resetting blocks of memory elements containing nothing but obsolete data is typically accomplished in a high percentage of the cases in the background, therefore not adversely impacting the programming performance of the memory system.

With the use of block re-setting of memory elements, a three-dimensional array of variable resistive memory elements may be operated in a manner similar to current flash memory cell arrays. Resetting a block of memory elements to a common state corresponds to erasing a block of flash memory cells to an erased state. The individual blocks of memory elements herein may be further divided into a plurality of pages of storage elements, wherein the memory elements of a page are programmed and read together. This is like the use of pages in flash memories. The memory elements of an individual page are programmed and read together. Of course, when programming, those memory elements that are to store data that are represented by the reset state are not changed from the reset state. Those of the memory elements of a page that need to be changed to another state in order to represent the data being stored in them have their states changed by the programming operation.

3D Memory Architecture with Staircase Word Lines

U.S. Pat. No. 8,895,437 B2 discloses a 3D memory having memory elements arranged in a three-dimensional pattern defined by rectangular coordinates having x, y and z-directions and with a plurality of parallel planes or memory layers stacked in the z-direction over a semiconductor substrate. The memory elements are accessed by vertical local bit lines and a plurality of staircase word lines. Each staircase word line has a series of alternating segments and risers elongated respectively in the x-direction and z-direction traversing across the plurality of planes in the z-direction with a segment in each plane. The staircase word lines allow every flight of staircase word line to reach to the surface layer for hook-up. However, there is stair interconnection area (riser) penalty for each stairs. Moreover, the process of forming the riser connection in each staircase is complicated and additional lithography, etching, deposition processes for each stair-interconnection will incur high cost and increase defect density.

Figure 3:
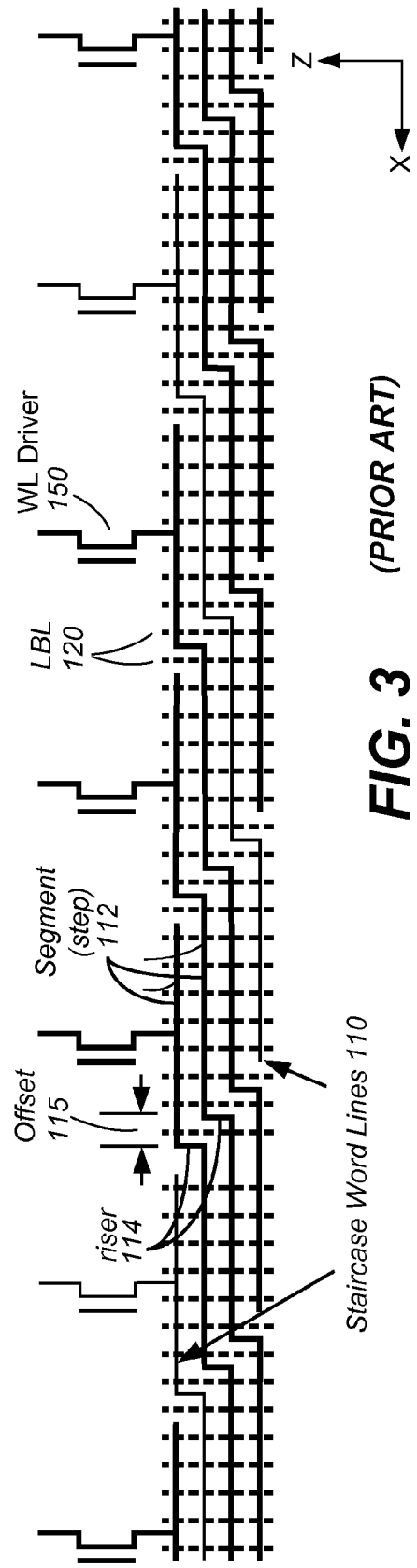
FIG. 3 illustrates a cross-section view of the 3D array along the y-direction in which a prior staircase word line 110 has a riser 114 to step to the next memory layer in between the local bit lines (LBL) 120.
Figure 4:
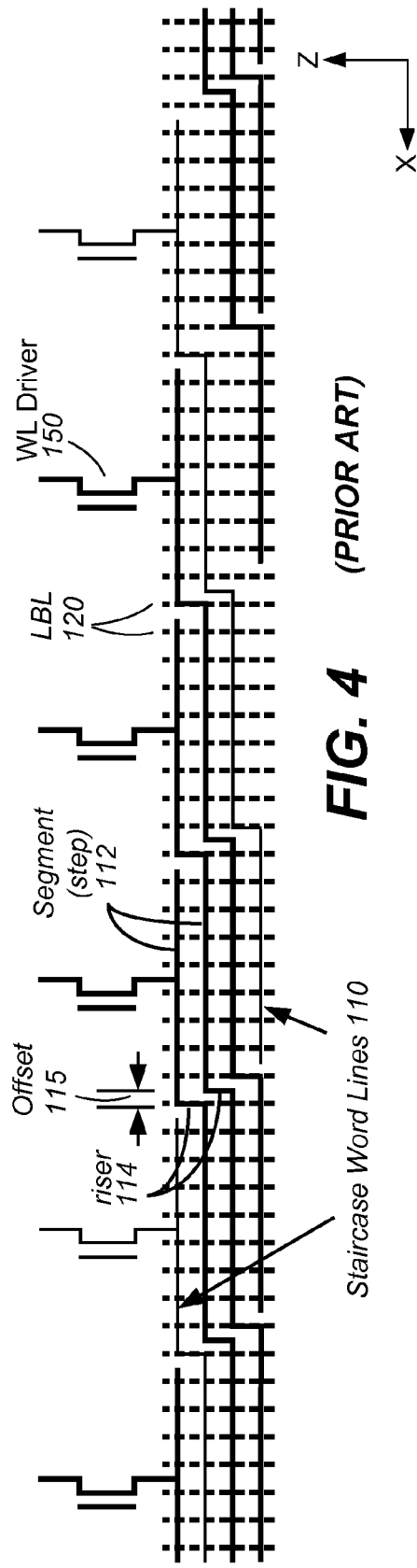
FIG. 4 illustrates a cross-section view of the 3D array along the y-direction in which prior various staggered staircase word lines are stacked as close as possible.

FIG. 3 and FIG. 4 show two variations of a prior scheme of implementing a riser joining two segments of a flight of staircase word line disclosed in U.S. Pat. No. 8,895,437 B2. The flight of staircase word line starts from a segment (or step) in a bottom memory layer and rises step-by-step to a segment in a fourth memory layer on top.

FIG. 3 illustrates a cross-section view of the 3D array along the y-direction in which a prior staircase word line 110 has a riser 114 to step to the next memory layer in between the local bit lines (LBL) 120. In this example, each staircase word line segment 112 selects 8 local bit lines 120 in each step or memory layer. There are 4 memory layers. Each step rises to the next layer in between a pair of adjacent local bit lines 120. Each flight of staircase word line has a segment at a top layer that can be connected to a word line driver 150. Adjacent staircase word lines on adjacent layers are staggered so that their risers 114 have an offset 115 along the x-direction given by the pitch of the local bit lines. The R/W element cross-section, defined by the bit line and the word line, is constant. Basically, adjacent flights of staircase word lines are offset in the x-direction by the pitch of the local bit line.

FIG. 4 illustrates a cross-section view of the 3D array along the y-direction in which prior various staggered staircase word lines are stacked as close as possible. In this example, each word line segment 112 selects 8 local bit lines in each step or memory layer. There are 4 memory layers. Each step rises to the next layer in between a pair of adjacent local bit lines 120. Two adjacent staircase word lines on adjacent layers are staggered so that their risers 114 have an offset 115 given by half the pitch of the local bit lines. The R/W element cross section differs. This configuration yields better array efficiency and has shorter word lines. Basically, adjacent flights of staircase word lines are offset in the x-direction by half the pitch of the local bit line.

The advantage of the staircase word line architecture is that word lines from different memory layers can be accessed easily as each eventually can be accessed and selected from either the top or bottom of the 3D memory array. In this way, interconnects and decoding are much simplified and there is no need to have multiple word lines connected in parallel to share limited resources. This will avoid the individual word line drivers having to drive a large load in the form of a large number of word lines in parallel and the ICC can be reduced. Within a given ICC budget, the performance is improved. Drivers implemented by devices with weaker drive power than CMOS devices may be used.

However, there is a stair-interconnection-area (riser) penalty for each stairs, which encroaches into the memory area. Moreover, the layer-by-layer process of forming the segment and the riser connections in each staircase is complicated. Additional lithography, etching, deposition processes for each stair-interconnection will incur higher cost and increase defect density.

Staircase Word Lines with Risers Formed by a Stairwell's Sidewalls

Figure 5:
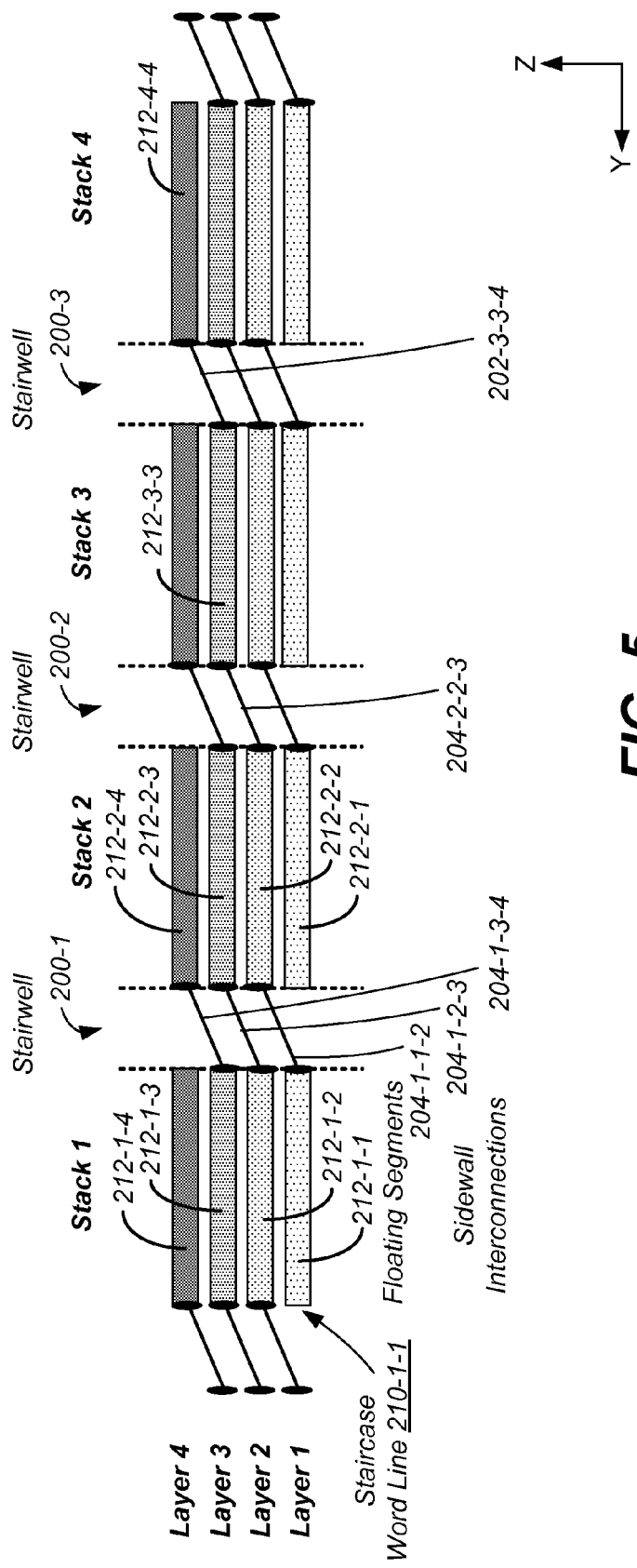
FIG. 5 illustrates schematically a staircase word line constituted by interconnecting a series of segments of word lines among different memory layers.

FIG. 5 illustrates schematically a staircase word line constituted by interconnecting a series of segments of word lines among different memory layers. Essentially, the 3D memory is formed with stacks of segments that are floating, such as stacks 1-4. In the example, the 3D memory has four memory layers. Four stacks are shown and each stack will have four segments. For example, in Stack 1, the four segments from layer 1 to layer 4 are respectively segments 212-1-1, 212-1-2, 212-1-3 and 212-1-4. Similarly, the segments in Stack 2 are 212-2-1, 212-2-2, 212-2-3 and 212-2-4. A staircase word line, such as staircase word line 210-1-1 is formed by interconnecting in turn the segment 212-1-1 to the segment 212-2-2 to the segment 212-3-3 and to the segment 212-4-4.

A stairwell between two adjacent stacks provides a series of concentric conductive sidewalls that are isolated from each other and each is selectively interconnecting a floating segment in one stack to another floating segment at a next higher layer in an adjacent stack. For example, for stairwell 200-1 between stack 1 and stack 2, a first conductive sidewall 204-1-3-4 selectively interconnects the segments 212-1-3 and 212-2-4. A second conductive sidewall 204-1-2-3 selectively interconnects the segments 212-1-2 and 212-2-3. A first conductive sidewall 204-1-1-2 selectively interconnects the segments 212-1-1 and 212-2-2.

Thus, the staircase word line 210-1-1 is formed by interconnecting the segments 212-4-4 and 212-3-3 using a first conductive sidewall 204-3-3-4 of the stairwell 200-3, and interconnecting the segments 212-3-3 and 212-2-2 using a second conductive sidewall 204-2-2-3 of the stairwell 200-2, and interconnecting the segments 212-2-2 and 212-1-1 using a third conductive sidewall 204-1-1-2 of the stairwell 200-1.

Figure 6:
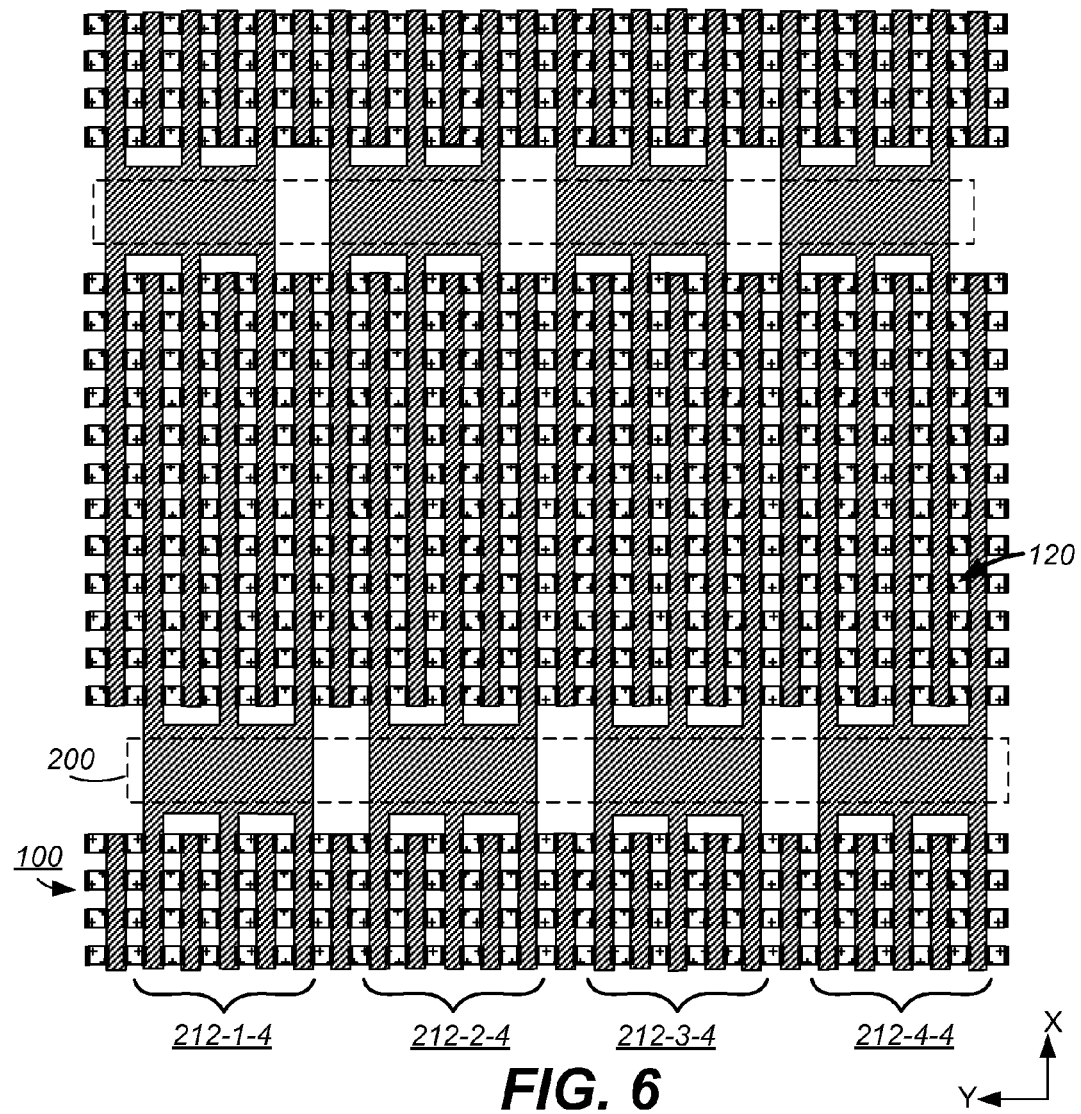
FIG. 6 is a plan view along the z-direction illustrating the memory array partitioned into memory cell portions 100 and stairwells portions 200.

FIG. 6 is a plan view along the z-direction illustrating the memory array partitioned into memory cell portions 100 and stairwells portions 200. In this example, the local bit lines (LBLs) 120 are along the z-direction running through four memory layers stacked on top of each other. In each memory layer, each word line segment along the y-direction is shown as a spine of a word line comb with three fingers emanating from a positive x-direction and three other fingers emanating from an opposite direction. At memory layer 4 (top layer) the segments 212-1-4, 212-2-4, 212-3-4 and 212-4-4 are shown. In general, a word line segment having other number of fingers is equally applicable. Each segment in a memory layer will be connected to an adjacent segment at the next upper memory layer. The inter-segment connection is made in a stairwell portion 200. It can be seen that there is no hook-up or stair-interconnection penalty in the memory cell portion 100. For example, a stairwell portion 200 will need approximately 20 nm width per word line layer interconnection. If there are four memory layers, the width of the stairwell is approximately 60 nm. If there are 19 memory layers, the width of the stairwell is approximately 400 nm.

Figure 7:
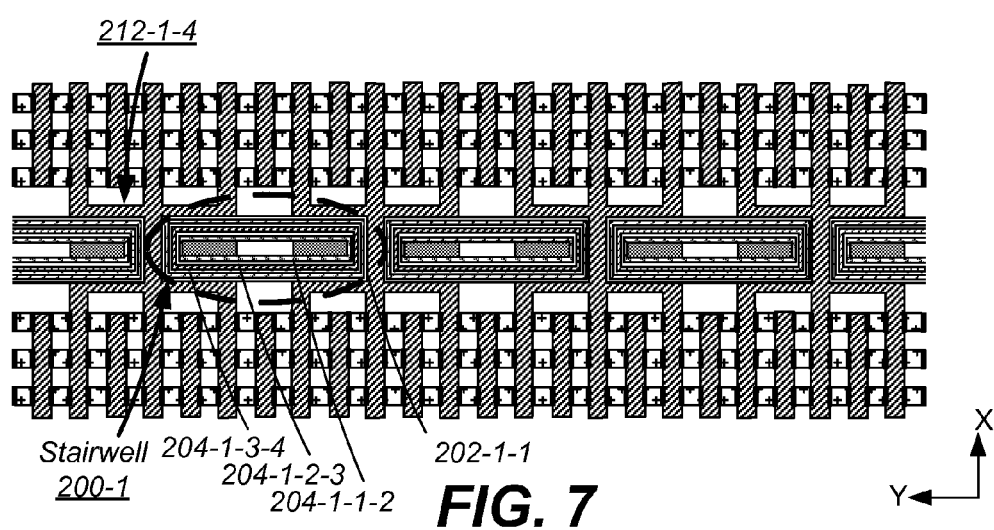
FIG. 7 is a plan view illustrating in more detail the stairwell portions shown in FIG. 6.

FIG. 7 is a plan view illustrating in more detail the stairwell portions shown in FIG. 6. Essentially, the inner walls (sidewalls) of the stairwell 200-1 are alternately lined with isolation oxide, such as isolation oxide coating 202-1-1, conductive coating 204-1-3-4, isolation oxide coating, conductive coating 204-1-2-3, isolation oxide coating and conductive coating 204-1-1-2. The stairwell 200-1 is formed by a sidewall process, including progressive etching from the top layer, each time exposing a pair of adjacent segments on two adjacent memory levels. The exposed adjacent segments are then interconnected by a conductive coating on one of the isolated sidewalls of the stairwell. Thus, for two adjacent stacks of floating segments, the sidewall process will interconnect from the lower left segment to the upper right segment.

Figure 8:
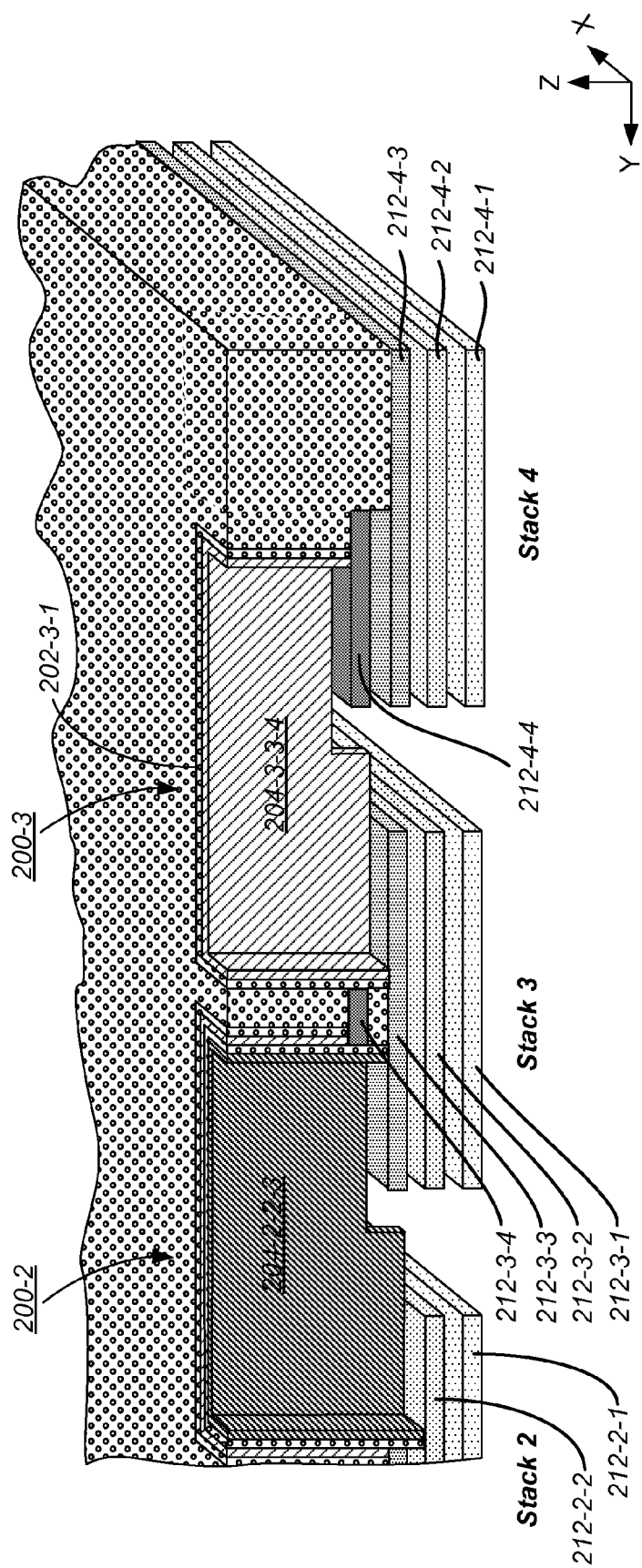
FIG. 8 illustrates a 3D perspective view of three stacks of word line segments straddled by two stairwells.

FIG. 8 illustrates a 3D perspective view of three stacks of word line segments straddled by two stairwells. In this example, segments in stack 2 are connected to respective segments in stack 3 by the metal interconnection sidewall 204-2-2-3 of the stairwell 200-2, Segments in stack 3 are connected to respective segments in stack 4 by the metal interconnection sidewall 204-3-3-4 of the stairwell 200-3. In particular the metal interconnection sidewall 204-2-2-3 interconnects the segment 212-2-2 in stack 2 to the segment 212-3-3 in stack 3. The metal interconnection sidewall 204-3-3-4 interconnects the segment 212-3-3 in stack 3 to the segment 212-4-4 in stack 4.

The examples given in FIG. 5 to FIG. 8 and the process associated with them to be described have the word line segment at each memory layer assume the form of a word line comb with fingers extending along the x-direction from a spine. The spine has a width along the y-direction that allows formation of stairwells between stacks along the y-direction. Thus, the spine might is regarded as the segment elongated in the y-direction in each memory layer to form a stack.

In a 3-D memory with non-comb word lines similar to those shown in FIG. 3 and FIG. 4, the word line will have a segment elongated along the x-direction at each memory layer and stepping up in the z-direction. It will be understood that the principle described, of using the sidewall of a stairwell to connect between two segments of different memory layers, will be the same. A sidewall will be disposed between adjacent stacks along the x-direction.

Process for Forming Staircase Word Lines Using Stairwell's Sidewall Connections

FIG. 9A to FIG. 19C illustrate the processes in forming the staircase word lines. The process starts with a 3D slab. The 3D slab comprises of alternate layers of isolation oxide and word line material on top of a substrate (not shown). The example 3D memory used in illustrating the process has four layers: layer 1 to layer 4. Thus, there are four layers of word line material in the slab. The word line layers are formed into stacks of floating word line segments (or segments corresponding to the steps of the staircase word lines). Four stacks, stack 1 to stack 4 are shown.

Connecting a Top Segment (Layer 4) in Each Stack to a Segment at a Next Lower Layer (Layer 3) of an Adjacent Stack First a multi-layer structure is formed on top of a semiconductor substrate. The multi-layer structure is repeated subsets of layers, each subset of layers including a layer of first conductive material for forming word lines and a dielectric layer. For example, the first conductive material is a metal, such as titanium.

The multi-layer structure is partitioned by opening a plurality of trenches and refilling with oxides to form a 2D array of segments in each first conductive material layer. The 2D array of segments from all first conductive material layer in the multi-layer structure constitute an array of stacks of segments, each stack of segments being a column of segments from each layer of first conductive material.

FIG. 9A is a top view of a portion of the 3D memory in the x-y plane illustrating the word line segment on top. Four stacks of segments are shown, similar to that those shown in FIG. 5. The top segment on stack 1 is segment 212-1-4, the top segment on stack 2 is segment 212-2-4, the top segment on stack 3 is segment 212-3-4, and the top segment on stack 4 is segment 212-4-4, FIG. 9B is a sectional view in the y-z plane of FIG. 9A. The example shows four memory layers and therefore each stack has four segments similar to those shown in FIG. 5.

FIG. 10A is a top view of a portion of the 3D memory in the x-y plane, illustrating the state of the stairwell portions after first and second maskings and corresponding first and second etchings. Between two adjacent left and right stacks of floating segments where interconnections are to be made, a stairwell such as stairwell 200-1 is excavated by the first masking and etching the top oxide layer to expose a portion of the segments 212-1-4 and 212-2-4 at memory layer 4. This is followed by the second masking and etching where only the left side of the stairwell is further etched down to expose the next segment 212-1-3 in memory layer 3. Thus, the stairwell 200-1 is exposing the segment 212-1-3 on the left stack in memory layer 3 and the segment 212-2-4 on the right stack in memory layer 4.

FIG. 10B is a sectional view in the y-z plane of the 3D memory shown in FIG. 10A. It can be seen more easily that there are two lithography processes. For example, the first etching step opens up the stairwell 200-1 and stops at the surface of the segments in layer 4. The second etching process etches the left half of the stairwell 200-1 and stops at the segment in the next layer down (layer 3).

Figure 11A:
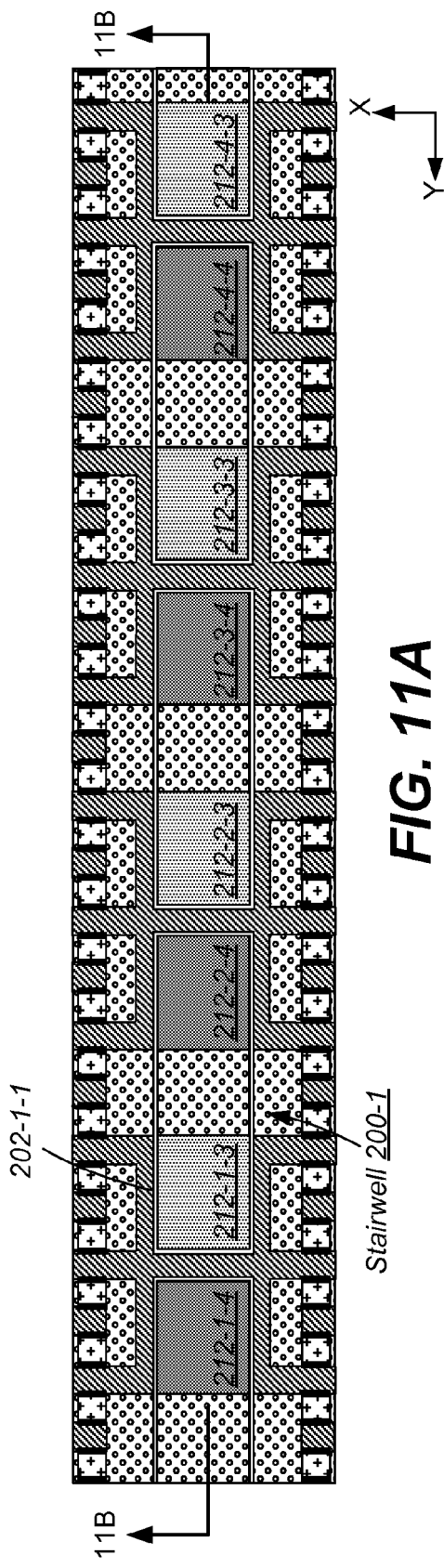
FIG. 11A is a top view of a portion of the 3D memory in the x-y plane, showing the state of the stairwell portion after deposition of an isolation layer and an anisotropic etch-back process to form the isolation layer on the sidewalls around the exposed portion of the stairwells.

FIG. 11A is a top view of a portion of the 3D memory in the x-y plane, showing the state of the stairwell portion after deposition of an isolation layer and an anisotropic etch-back process to form the isolation layer on the sidewalls around the exposed portion of the stairwells. For example, in the stairwell 200-1, the deposition process deposits the isolation layer 202-1-1. This is followed by the etch-back process that etches back the isolation layer 202-1-1 on the floor of the stairwell to expose the segments 212-1-3 and 212-2-4.

Figure 11B:
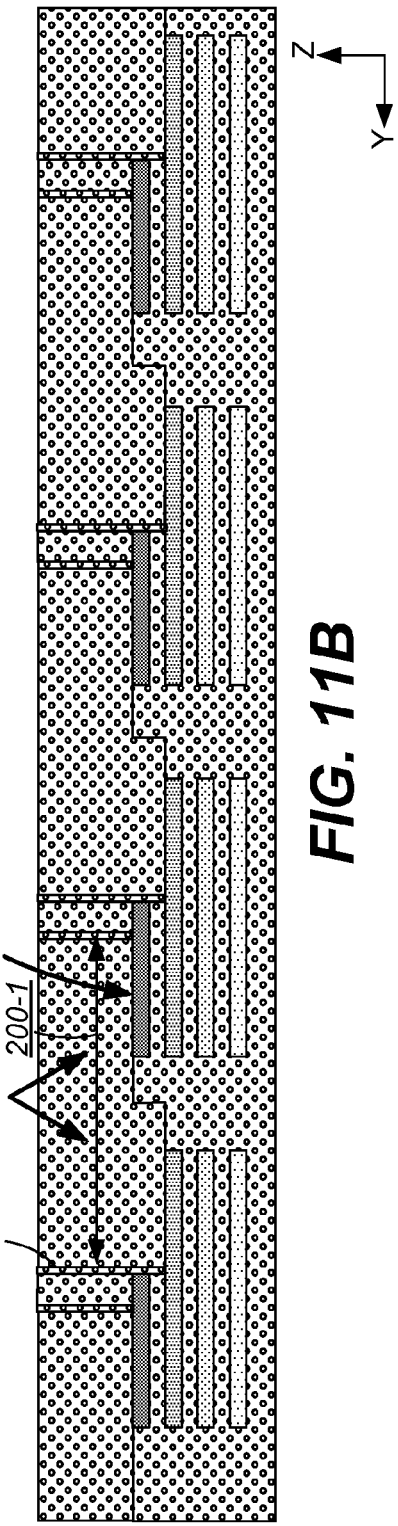
FIG. 11B is a sectional view in the y-z plane of the 3D memory shown in FIG. 11A.

FIG. 11B is a sectional view in the y-z plane of the 3D memory shown in FIG. 11A. It can be seen more easily that the isolation layer 202-1-1 isolates the previously exposed edge of the segment 212-1-4 in the stairwell 200-1.

Figure 12A:
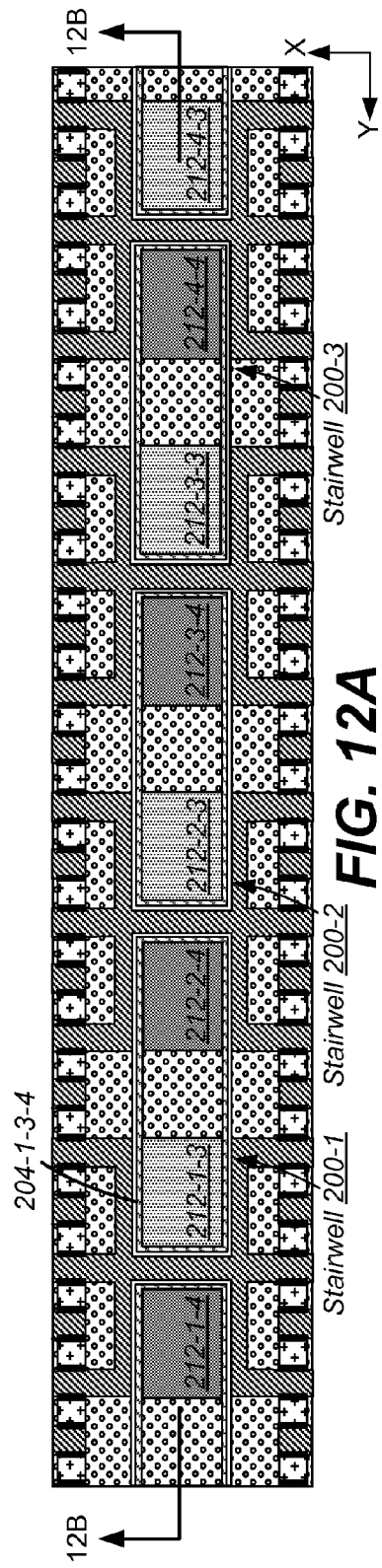
FIG. 12A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells.

FIG. 12A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells. For example, in the stairwell 200-1, the deposition process deposits the conductive layer 204-1-3-4.

This is followed by the etch-back process that etches back the conductive layer on the floor of the stairwell to expose the segments 212-1-3 and 212-2-4.

Figure 12B:
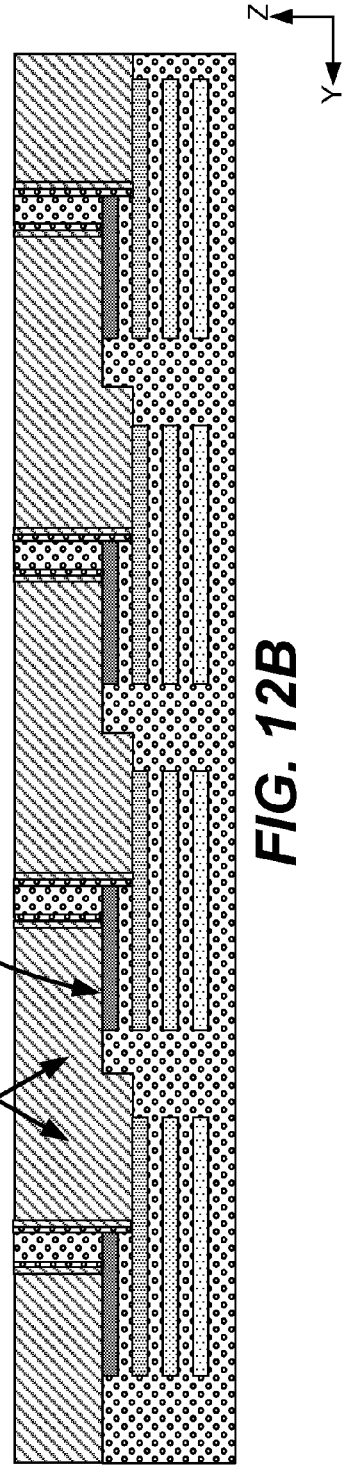
FIG. 12B is a sectional view in the y-z plane of the 3D memory shown in FIG. 12A.

FIG. 12B is a sectional view the y-z plane of the 3D memory shown in FIG. 12A. It can be seen more easily that the conductive layer 204-1-3-4 on the sidewalls of the stairwell 200-1 connects the segment 212-1-3 to the segment 212-2-4.

Figure 12C:
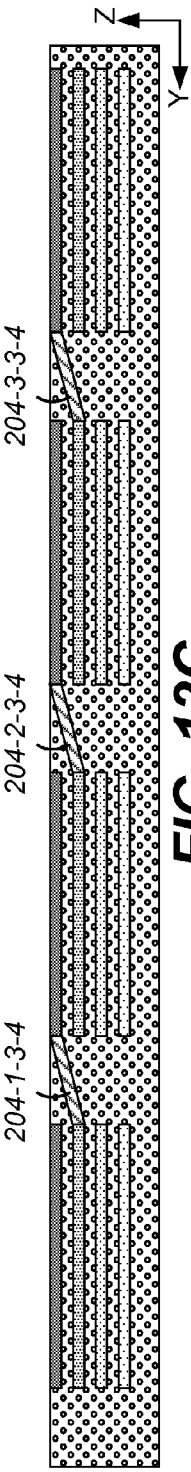
FIG. 12C is another sectional view in the y-z plane of the 3D memory shown in FIG. 12A.

FIG. 12C is another sectional view in the y-z plane of the 3D memory shown in FIG. 12A. It illustrates schematically, that in the stairwell 200-1, the sidewall conductive layer 204-1-3-4 connects the segment 212-1-3 to the segment 212-2-4. In the stairwell 200-2, the sidewall conductive layer 204-2-3-4 connects the segment 212-2-3 to the segment 212-3-4. In the stairwell 200-3, the sidewall conductive layer 204-3-3-4 connects the segment 212-3-3 to the segment 212-4-4.

Connecting a Segment (Layer 3) in Each Stack to a Segment at a Next Lower Layer (Layer 2) of an Adjacent Stack FIG. 13A to FIG. 15 illustrate the processes in forming the sidewall connection in each stairwell between adjacent segments located at a next lower layer (layer 3) and the next, next lower layer (layer 2).

The process for the next layer (layer 3 to layer 2) connection is essentially similar to that for (layer 4 to layer 3) described in connection with FIG. 10A to FIG. 12C.

Figure 13A:
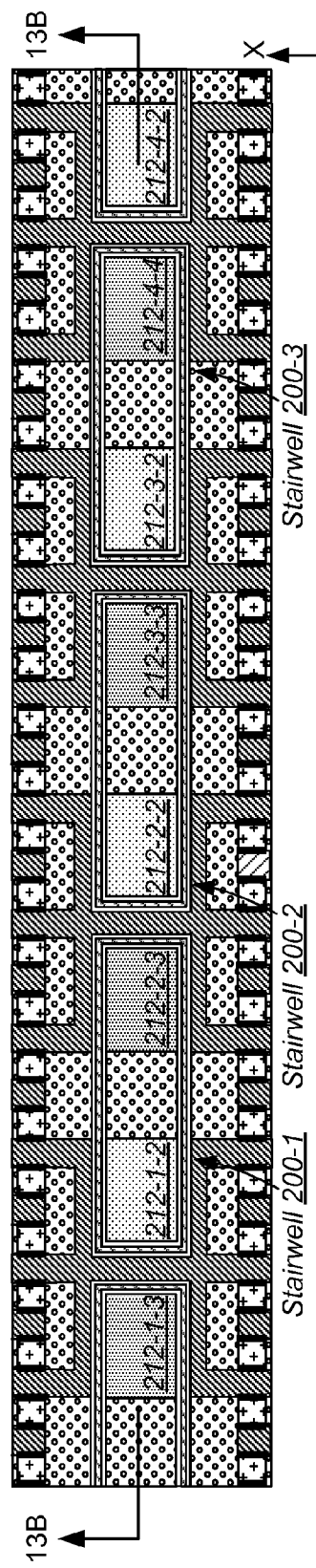
FIG. 13A is a top view of a portion of the 3D memory in the x-y plane, illustrating the state of the stairwell portions after first and second maskings and corresponding first and second etchings.

FIG. 13A is a top view of a portion of the 3D memory in the x-y plane, illustrating the state of the stairwell portions after first and second maskings and corresponding first and second etchings. Between two adjacent left and right stacks of floating segments where interconnections are to be made, the stairwell such as stairwell 200-1 is further excavated by the first masking and etching the top oxide layer to expose a portion of the segments 212-1-3 and 212-2-3 at memory layer 3. This is followed by the second masking and etching where only the left side of the stairwell is further etched down to expose the next segment 212-1-2 in memory layer 2. Thus, the stairwell 200-1 is exposing the segment 212-1-2 on the left stack in memory layer 2 and the segment 212-2-3 on the right stack in memory layer 3.

Figure 13B:
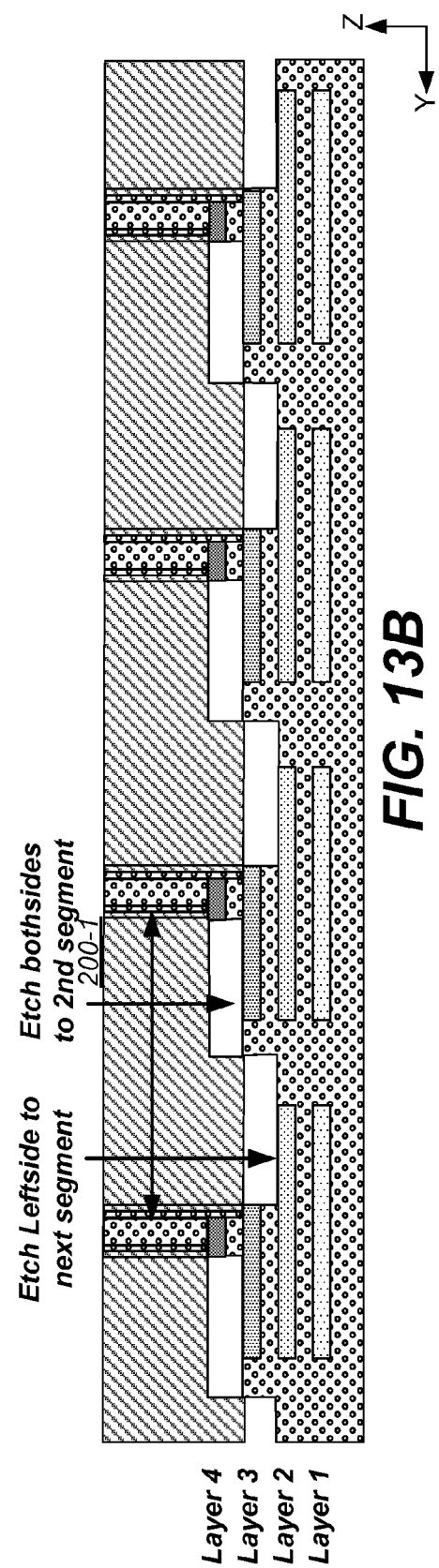
FIG. 13B is a sectional view in the y-z plane of the 3D memory shown in FIG. 13A.

FIG. 13B is a sectional view in the y-z plane of the 3D memory shown in FIG. 13A. It can be seen more easily that there are two lithography processes. For example, the first etching step further opens up the stairwell 200-1 and stops at the surface of the segments in layer 3. The second etching process etches the left half of the stairwell 200-1 and stops at the segment in the next layer down (layer 2).

FIG. 14A is a top view of a portion of the 3D memory in the x-y plane, showing the state of the stairwell portion after deposition of an isolation layer and an anisotropic etch-back process to form the isolation layer on the sidewalls around the exposed portion of the stairwells. For example, in the stairwell 200-1, the deposition process deposits the isolation layer 202-1-2. This is followed by the etch-back process that etches back the isolation layer 202-1-2 on the floor of the stairwell to expose the segments 212-1-2 and 212-2-3.

FIG. 14B is a sectional view in the y-z plane of the 3D memory shown in FIG. 14A. It can be seen more easily that the isolation layer 202-1-2 isolates the previously exposed edge of the segment 212-1-3 in the stairwell 200-1.

Figure 15A:
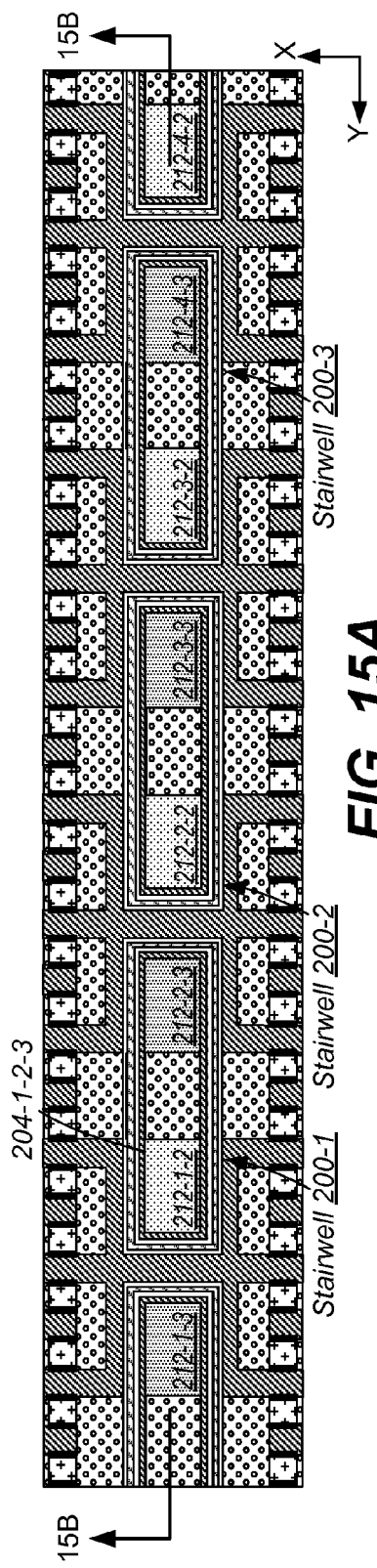
FIG. 15A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells.

FIG. 15A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells. For example, in the stairwell 200-1, the deposition process deposits the conductive layer 204-1-2-3.

This is followed by the etch-back process that etches back the conductive layer on the floor of the stairwell to expose the segments 212-1-2 and 212-2-3.

Figure 15B:
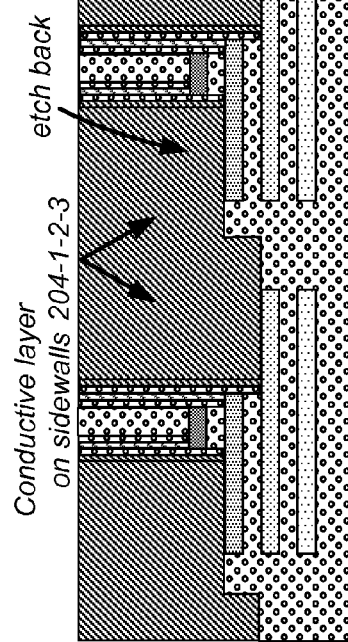
FIG. 15B is a sectional view in the y-z plane of the 3D memory shown in FIG. 15A.

FIG. 15B is a sectional view in the y-z plane of the 3D memory shown in FIG. 15A. It can be seen more easily that the conductive layer 204-1-2-3 on the sidewalls of the stairwell 200-1 connects the segment 212-1-2 to the segment 212-2-3.

Figure 15C:
FIG. 15C is another sectional view in the y-z plane of the 3D memory shown in FIG. 15A.

FIG. 15C is another sectional view in the y-z plane of the 3D memory shown in FIG. 15A. It illustrates schematically, that in the stairwell 200-1, the sidewall conductive layer 204-1-2-3 connects the segment 212-1-2 to the segment 212-2-3. In the stairwell 200-2, the sidewall conductive layer 204-2-2-3 connects the segment 212-2-2 to the segment 212-3-3. In the stairwell 200-3, the sidewall conductive layer 204-3-2-3 connects the segment 212-3-2 to the segment 212-4-3.

Connecting a Segment (Layer 2) in Each Stack to a Segment at a Next Lower Layer (Layer 1) of an Adjacent Stack FIG. 16A to FIG. 18C illustrate the processes in forming the sidewall connection in each stairwell between adjacent segments located at a next lower layer (layer 2) and the next, next lower layer (layer 1).

The process for the next layer (layer 2 to layer 1) connection is essentially similar to that for (layer 4 to layer 3) described in connection with FIG. 10A to FIG. 12C.

Figure 16A:
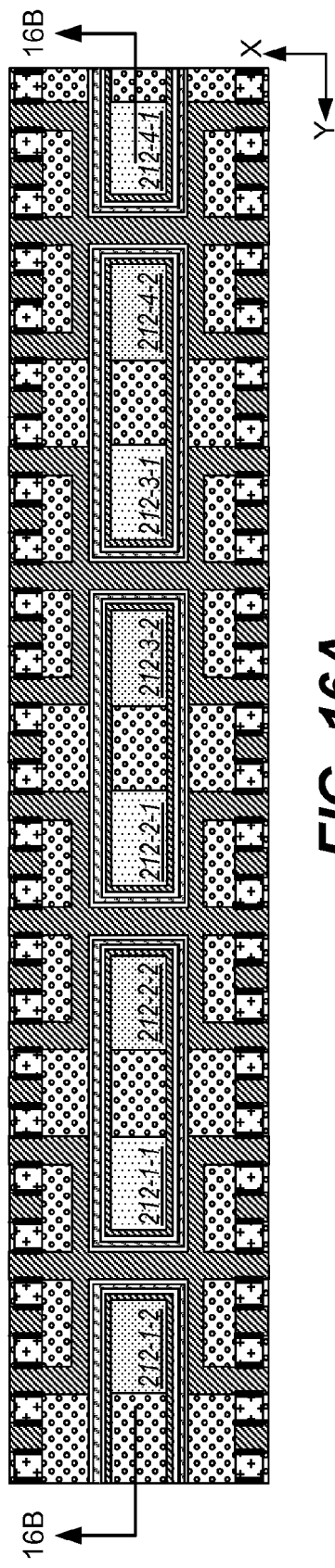
FIG. 16A is a top view of a portion of the 3D memory in the x-y plane, illustrating the state of the stairwell portions after first and second maskings and corresponding first and second etchings.

FIG. 16A is a top view of a portion of the 3D memory in the x-y plane, illustrating the state of the stairwell portions after first and second maskings and corresponding first and second etchings. Between two adjacent left and right stacks of floating segments where interconnections are to be made, the stairwell such as stairwell 200-1 is further excavated by the first masking and etching the top oxide layer to expose a portion of the segments 212-1-2 and 212-2-2 at memory layer 2. This is followed by the second masking and etching where only the left side of the stairwell is further etched down to expose the next segment 212-1-1 in memory layer 1. Thus, the stairwell 200-1 is exposing the segment 212-1-1 on the left stack in memory layer 1 and the segment 212-2-2 on the right stack in memory layer 2.

Figure 16B:
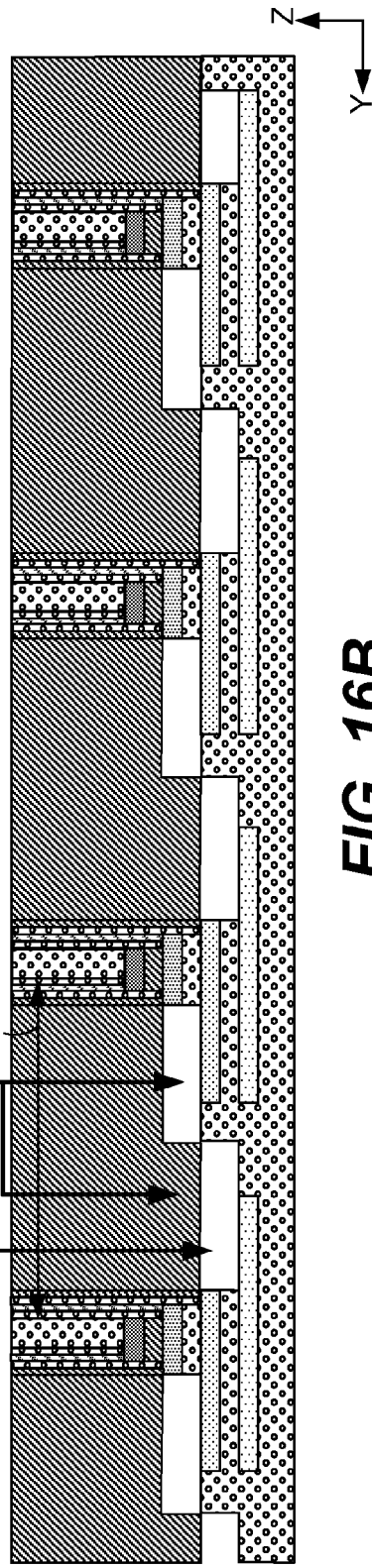
FIG. 16B is a sectional view in the y-z plane of the 3D memory shown in FIG. 16A.

FIG. 16B is a sectional view in the y-z plane of the 3D memory shown in FIG. 16A. It can be seen more easily that there are two lithography processes. For example, the first etching step opens up the stairwell 200-1 and stops at the surface of the segments in layer 2. The second etching process etches the left half of the stairwell 200-1 and stops at the segment in the next layer down (layer 1).

Figure 17A:
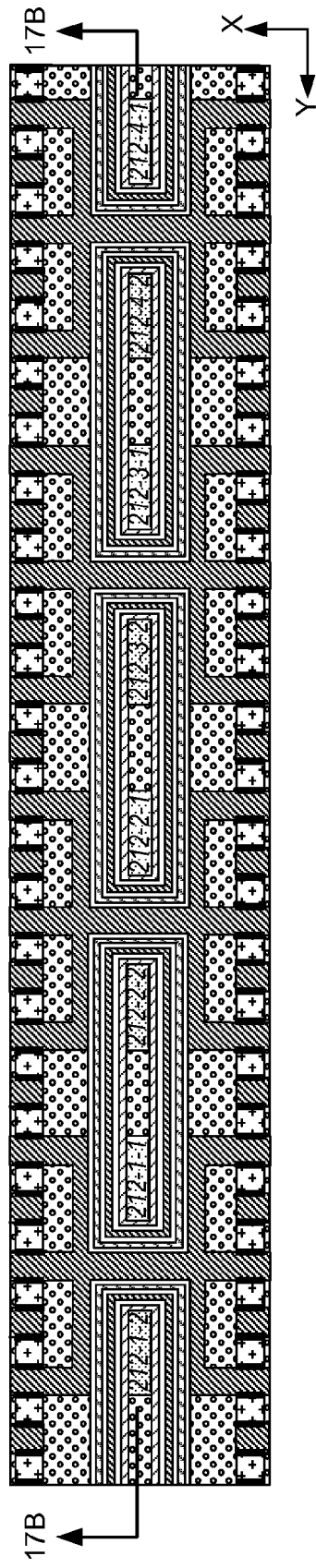
FIG. 17A is a top view of a portion of the 3D memory in the x-y plane, showing the state of the stairwell portion after deposition of an isolation layer and an anisotropic etch-back process to form the isolation layer on the sidewalls around the exposed portion of the stairwells.

FIG. 17A is a top view of a portion of the 3D memory in the x-y plane, showing the state of the stairwell portion after deposition of an isolation layer and an anisotropic etch-back process to form the isolation layer on the sidewalls around the exposed portion of the stairwells. For example, in the stairwell 200-1, the deposition process deposits the isolation layer 202-1-3. This is followed by the etch-back process that etches back the isolation layer 202-1-3 on the floor of the stairwell to expose the segments 212-1-1 and 212-2-2.

Figure 17B:
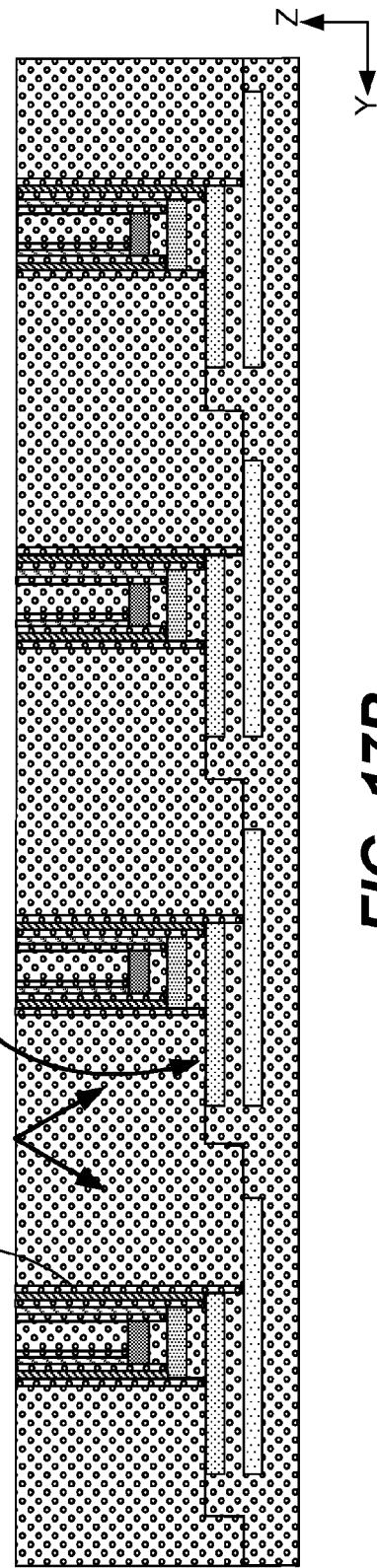
FIG. 17B is a sectional view in the y-z plane of the 3D memory shown in FIG. 17A.

FIG. 17B is a sectional view in the y-z plane of the 3D memory shown in FIG. 17A. It can be seen more easily that the isolation layer 202-1-3 isolates the previously exposed edge of the segment 212-1-2 in the stairwell 200-1.

Figure 18A:
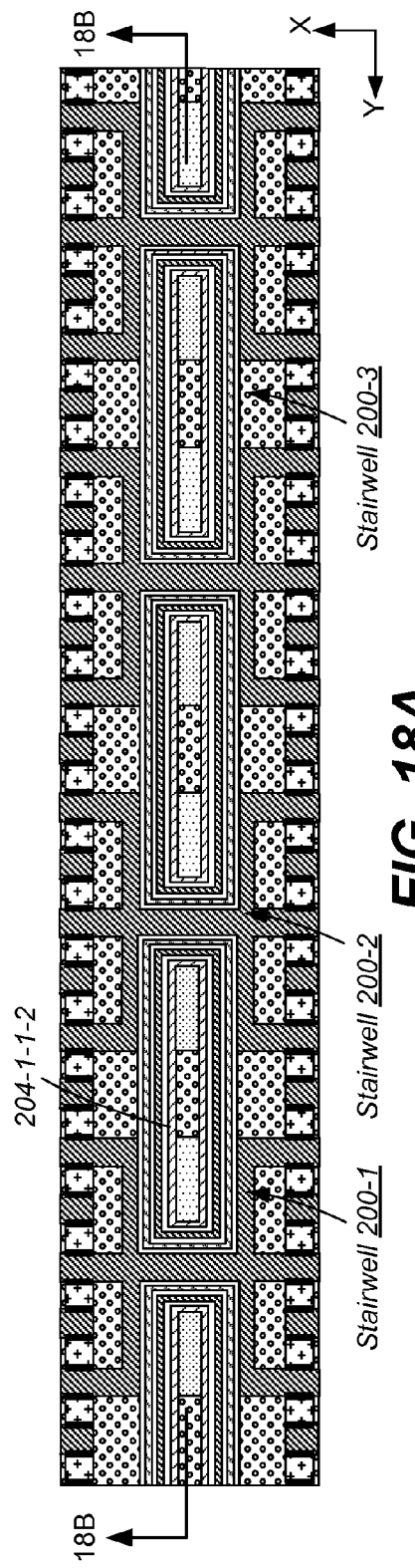
FIG. 18A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells.

FIG. 18A is a top view of a portion of the 3D memory in the x-y plane, showing the state of the stairwell portions after deposition of a second conductive layer (e.g., a metal layer) and an anisotropic etch-back process to form the conductive layer on the sidewalls around the exposed portion of the stairwells. For example, in the stairwell 200-1, the deposition process deposits the conductive layer 204-1-1-2.

This is followed by the etch-back process that etches back the conductive layer on the floor of the stairwell to expose the segments 212-1-1 and 212-2-2.

Figure 18B:
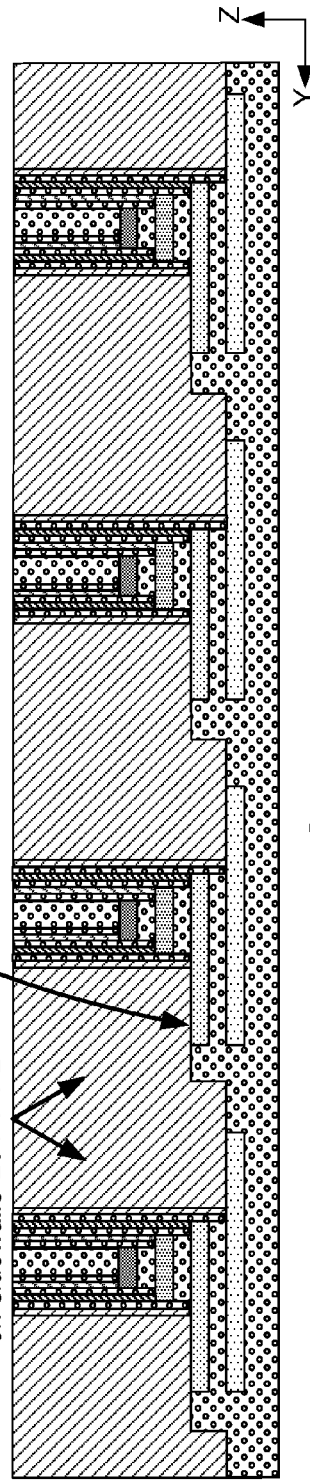
FIG. 18B is a sectional view in the y-z plane of the 3D memory shown in FIG. 18A.

FIG. 18B is a sectional view in the y-z plane of the 3D memory shown in FIG. 18A. It can be seen more easily that the conductive layer 204-1-1-2 on the sidewalls of the stairwell 200-1 connects the segment 212-1-1 to the segment 212-2-2.

Figure 18C:
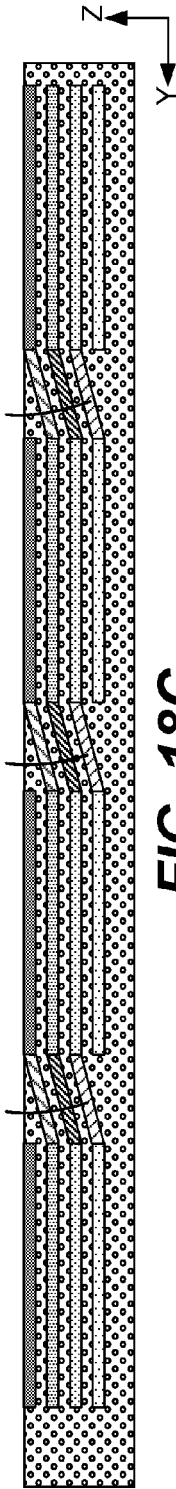
FIG. 18C is another sectional view in the y-z plane of the 3D memory shown in FIG. 18A.

FIG. 18C is another sectional view in the y-z plane of the 3D memory shown in FIG. 18A. It illustrates schematically, that in the stairwell 200-1, the sidewall conductive layer 204-1-1-2 connects the segment 212-1-1 to the segment 212-2-2. In the stairwell 200-2, the sidewall conductive layer 204-2-1-2 connects the segment 212-2-1 to the segment 212-3-2. In the stairwell 200-3, the sidewall conductive layer 204-3-1-2 connects the segment 212-3-1 to the segment 212-4-2.

FIG. 19A is a top view of a portion of the 3D memory in the x-y plane, showing the state of the stairwell portions after a gap fill process which is consist of SiO2 fill 206 and SiO2 CMP (chemical-mechanical planarization).

FIG. 19B is a sectional view in the y-z plane of the 3D memory shown in FIG. 19A.

FIG. 19C is a sectional view in the y-z plane of the 3D memory shown in FIG. 19A. It also shows the image of side wall interconnection image.

VIA Formation Between Different Memory Layers

The stairwell and sidewall structures and processes have been described with specific examples of connecting between adjacent segments that are residing in adjacent memory layers, which is suitable for forming the risers of a staircase word line. However, the same principles and techniques are equally applicable to connecting between adjacent segments that are residing in any different memory layers. For example, the first segment from stack 1 can be connected to the second segment from stack 2, where the first segment is in the four memory layer and the second segment is in the first memory layer. The stairwell excavation process will expose the first segment and the second segment and then the sidewall process will connect the two segments. In general, a first conductive element in a first layer and a second conductive element in a second layer can be connected by exposing portions of the first and second conductive elements in a stairwell and connecting them with a sidewall process. This is suitable for forming a via between elements at different layers.

Alternative Bifurcated Sidewall Process

The sidewall process flow, described earlier, makes the sidewall interconnection layer-by-layer. At each process layer, a segment in a high memory layer is connected by a sidewall process to a segment in a lower memory layer. In an alternative dual sidewall approach, it is possible to form two floating segment interconnections through one side wall process by splitting into upper and lower sidewalls. In the follow example, the 3D memory has five memory layers, memory layers 1-5. The word line segment in layer 1 will be WL1, in layer 2 will be WL2, in layer 3 will be WL3, in layer 4 will be WL4, and in layer 5 will be WL5.

Figure 20:
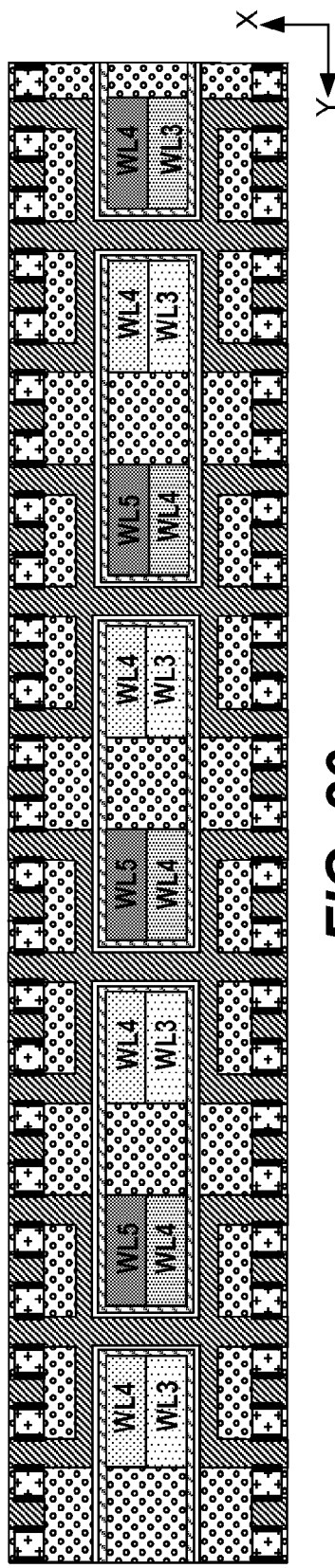
FIG. 20 illustrates the first bifurcated sidewall interconnection in a stairwell.

FIG. 20 shows a bifurcated sidewall process involving three different segments at three different memory layers inside a stairwell. The stairwell is partitioned into an upper and a lower half (when viewed in the x-y plane). The upper half has the excavation process so that WL5 and WL4 are exposed. The lower half has the excavation process so that WL4 and WL3 are exposed. A sidewall process will initially connects all WL5, WL4, WL3 and WL2 together. In particular, an upper sidewall connects WL5 to WL4 and a lower sidewall connects WL4 to WL3.

Figure 21:
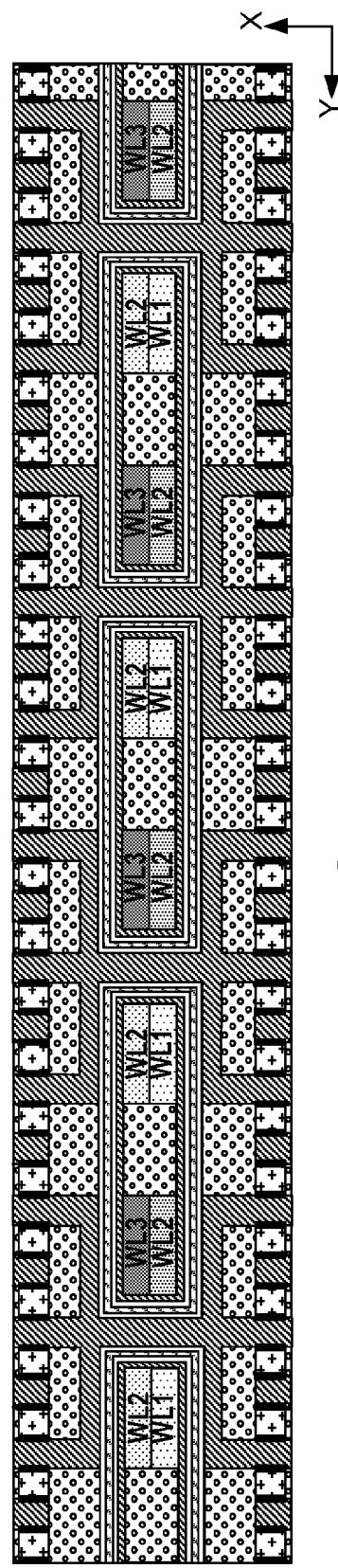
FIG. 21 illustrates the second bifurcated sidewall interconnection process.

FIG. 21 illustrates a second bifurcated sidewall interconnection process similar to that shown in FIG. 20. As a result, the upper sidewall connects WL3 to WL2 and the lower sidewall connects WL2 to WL1.

Figure 22:
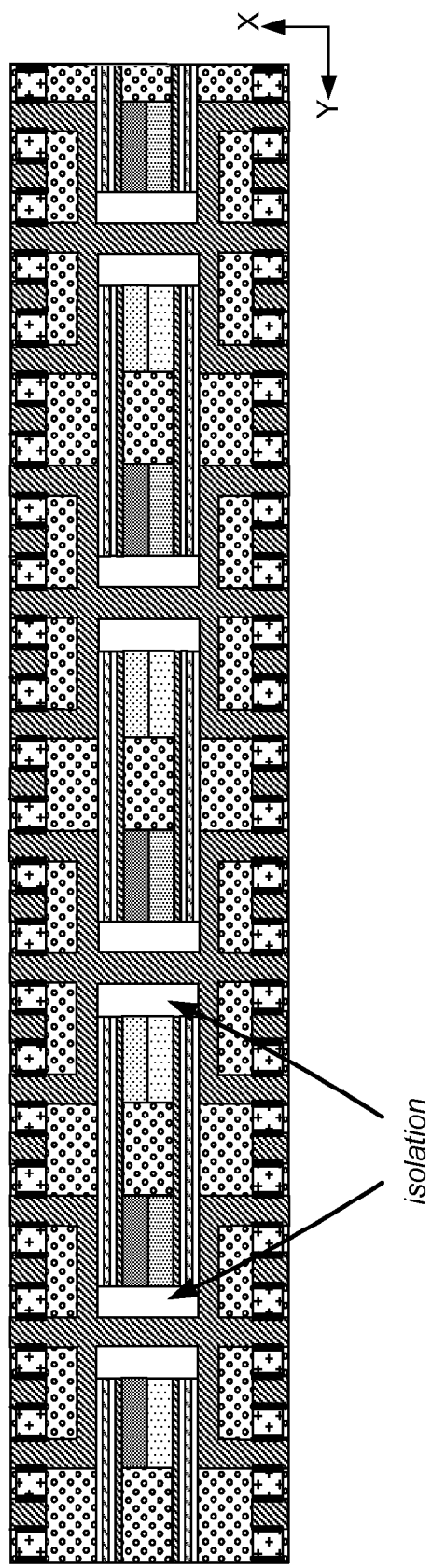
FIG. 22 shows the sidewall Loop-cut where Upper sidewall and lower sidewall are isolated.

FIG. 22 shows the sidewall loop-cut where upper sidewall and lower sidewall are isolated. Using the bifurcated sidewall process, only half the number of sidewall processes are needed compared to the earlier described single sidewall process. For example, only 8 sidewall processes are needed to connect segments among 19 memory layers. Also, in one example, the width of the sidewall interconnection is 400 nm approximately for a 19 layer WL segment stack, when each metal sidewall is 10 nm thick and the isolation sidewall is 10 nm thick and the remaining space between the upper and lower walls after 8 side wall process is 40 nm.

Conclusion

The foregoing detailed description has been presented for purposes of illustration and description. It is not intended to be exhaustive or to limit the above to the precise form disclosed. Many modifications and variations are possible in light of the above teaching. The described embodiments were chosen in order to explain the principles involved and its practical application, to thereby enable others to best utilize the various embodiments and with various modifications as are suited to the particular use contemplated. It is intended that the scope be defined by the claims appended hereto.

It is claimed:

1. A non-volatile memory, comprising:
   memory elements arranged in a three-dimensional pattern in a plurality of memory layers stacked over a semiconductor substrate;
   a plurality of segments disposed to form a plurality of arrays of segments, each array of segments disposed in a respective memory layer of the plurality of memory layers, each segment of the plurality of segments being a segment of a respective staircase word line, the respective staircase word line extending from a bottom memory layer to a top memory layer of the plurality of memory layers,
   wherein the plurality of segments are further disposed to form an array of stacks of segments, each stack of segments comprising a column of segments that spans the plurality of memory layers; and
   a stairwell located between adjacent first and second stacks of segments, said stairwell having a sidewall comprising an insulated conductive sidewall layer, the insulated conductive sidewall layer providing a riser to connect a first segment in the first stack to a second segment in the second stack, and wherein the first and second segments are disposed in different memory layers of the plurality of memory layers.

2. The non-volatile memory of claim 1, wherein the first segment is disposed in a first a memory layer and the second segment is disposed in a second memory layer directly above the first memory layer.

3. The non-volatile memory of claim 1, further comprising:
   a plurality of bit line pillars disposed through the plurality of memory layers, wherein each segment of the plurality of segments crosses a predetermined number of bit line pillars of the plurality of bit line pillars.

4. The non-volatile memory of claim 1, further comprising:
   a word line driver disposed above the top memory layer of the plurality of memory layers, the word line driver connected to the respective staircase word line.

5. The non-volatile memory of claim 1, wherein the plurality of segments are metallic.

6. The non-volatile memory of claim 1, wherein the insulated conducting conductive sidewall layer is metallic.

7. The non-volatile memory of claim 1, wherein the insulated conductive sidewall layer comprises interleaving insulating oxide layers.

8. The non-volatile memory of claim 1, wherein the stairwell comprises an oxide filling material.

9. The non-volatile memory of claim 1, wherein a resistance of a memory element of the memory elements varies inversely proportionally to a voltage or a current applied to the memory element.

10. A non-volatile memory, comprising:
    a plurality of segments disposed in a plurality of layers to form first and second segment stacks, each of the first and second segment stacks spanning the plurality of layers, and each segment of the plurality of segments corresponding to a segment of a respective staircase word line; and
    a stairwell, located between the first and second segment stacks, comprising an insulated conductive sidewall layer, the insulated conductive sidewall layer comprising a riser to connect a first segment of the first segment stack to a second segment of the second segment stack, the first and second segments being disposed in different layers of the plurality of layers.

11. The non-volatile memory of claim 10, wherein the first segment is disposed in a first a layer and the second segment is disposed in a second layer directly above the first layer.

12. The non-volatile memory of claim 10, further comprising:
    a plurality of memory elements disposed in the plurality of layers to form a three-dimensional arrangement.

13. The non-volatile memory of claim 10, wherein the respective staircase word line extends from a bottom layer to a top layer of the plurality of layers.

14. The non-volatile memory of claim 10, further comprising:
    a word line driver disposed above a top layer of the plurality of layers, the word line driver connected to the respective staircase word line.

15. The non-volatile memory of claim 10, wherein the plurality of segments are metallic.

16. The non-volatile memory of claim 10, wherein the insulated conductive sidewall layer is metallic.

17. The non-volatile memory of claim 10, wherein the insulated conductive sidewall layer comprises interleaving insulating oxide layers.

18. A non-volatile memory, comprising:
    first and second segment stacks, each of the first and second segment stacks comprising a respective plurality of segments, each segment of the respective plurality of segments disposed in a respective layer of a plurality of layers and corresponding to a segment of a respective staircase word line; and
    a stairwell, located between the first and second segment stacks, comprising a conductive sidewall layer, the conductive sidewall layer comprising a riser to connect a first segment of the first segment stack to a second segment of the second segment stack, the first and second segments being disposed in different layers of the plurality of layers.

19. The non-volatile memory of claim 18, wherein the conductive sidewall layer is insulated by interleaving oxide layers.

20. The non-volatile memory of claim 18, wherein the first segment is disposed in a first a layer and the second segment is disposed in a second layer directly above the first layer.

* * * * *